(12) United States Patent
Jung

(10) Patent No.: US 11,417,680 B2
(45) Date of Patent: Aug. 16, 2022

(54) SEMICONDUCTOR MEMORY DEVICE AND MANUFACTURING METHOD THEREOF

(71) Applicant: SK hynix Inc., Icheon-si (KR)

(72) Inventor: Sung Wook Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 131 days.

(21) Appl. No.: 17/015,614

(22) Filed: Sep. 9, 2020

(65) Prior Publication Data

US 2021/0313343 A1 Oct. 7, 2021

(30) Foreign Application Priority Data

Apr. 7, 2020 (KR) ........................ 10-2020-0042389

(51) Int. Cl.
| | | |
|---|---|---|
| *H01L 27/11582* | (2017.01) | |
| *H01L 27/11519* | (2017.01) | |
| *H01L 27/11524* | (2017.01) | |
| *H01L 27/11556* | (2017.01) | |
| *H01L 27/11529* | (2017.01) | |
| *H01L 27/11548* | (2017.01) | |
| *H01L 23/535* | (2006.01) | |
| *H01L 27/1157* | (2017.01) | |

(Continued)

(52) U.S. Cl.
CPC ...... *H01L 27/11582* (2013.01); *H01L 23/535* (2013.01); *H01L 27/1157* (2013.01); *H01L 27/11519* (2013.01); *H01L 27/11524* (2013.01); *H01L 27/11529* (2013.01); *H01L 27/11548* (2013.01); *H01L 27/11556* (2013.01); *H01L 27/11565* (2013.01); *H01L 27/11573* (2013.01); *H01L 27/11575* (2013.01); *H01L 27/249* (2013.01); *H01L 27/2454* (2013.01); *H01L 45/06* (2013.01)

(58) Field of Classification Search
CPC ............ H01L 27/11582; H01L 23/535; H01L 27/11519; H01L 27/11524; H01L 27/11529; H01L 27/11548; H01L 27/11556; H01L 27/11565; H01L 27/1157; H01L 27/11573; H01L 27/11575; H01L 27/2454; H01L 27/249; H01L 45/06; H01L 27/11568; H01L 21/76816; H01L 21/76897
See application file for complete search history.

(56) References Cited

U.S. PATENT DOCUMENTS 9,960,177 B2 5/2018 Ahn
10,355,009 B1 7/2019 Kai et al.
(Continued)

*Primary Examiner* — Allison Bernstein
(74) *Attorney, Agent, or Firm* — William Park & Associates Ltd.

(57) ABSTRACT

There are provided a semiconductor memory device and a manufacturing method thereof. The semiconductor memory device includes a first select group and a second select group isolated from each other by an isolation insulating layer; an upper gate stack structure extending to overlap with the first select group, the isolation insulating layer, and the second select group; channel structures extending to penetrate the first select group, the second select group, and the upper gate stack structure; and a vertical connection structure spaced apart from the first select group, the second select group, and the upper gate stack structure, the vertical connection structure extending in parallel to the channel structures.

16 Claims, 25 Drawing Sheets

(51) Int. Cl.
  *H01L 27/11573* (2017.01)
  *H01L 27/11575* (2017.01)
  *H01L 45/00* (2006.01)
  *H01L 27/24* (2006.01)
  *H01L 27/11565* (2017.01)

(56) References Cited

U.S. PATENT DOCUMENTS

| | | |
|---|---|---|
| 10,396,090 B2 | 8/2019 | Lee |
| 11,056,503 B2 * | 7/2021 | Kim .................. H01L 27/11582 |
| 2021/0217769 A1 * | 7/2021 | Lee .................. H01L 27/11565 |

* cited by examiner

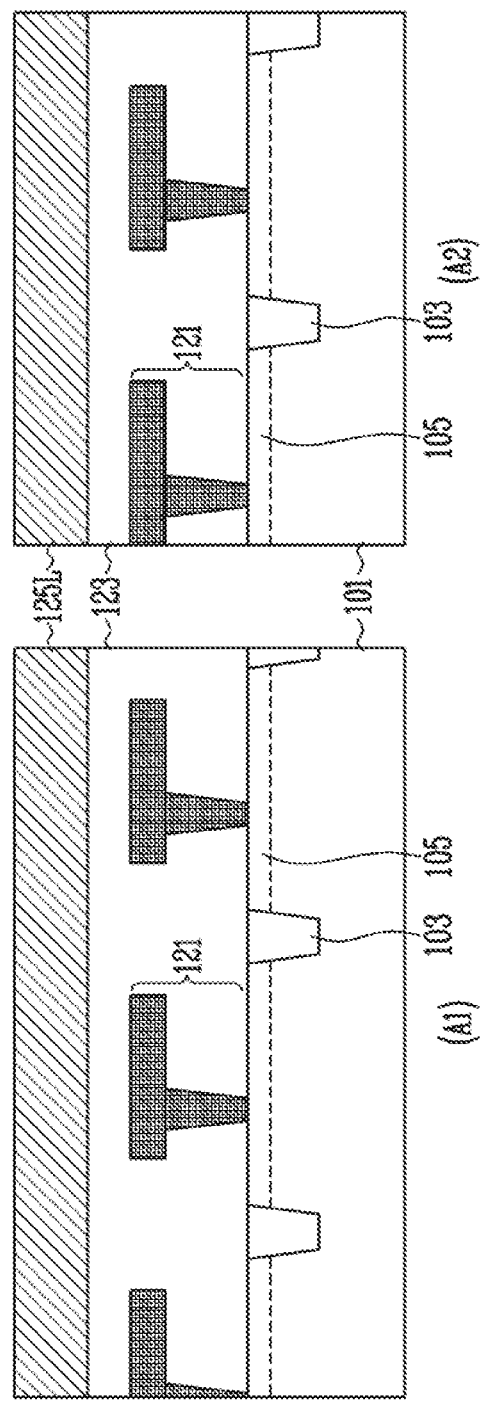

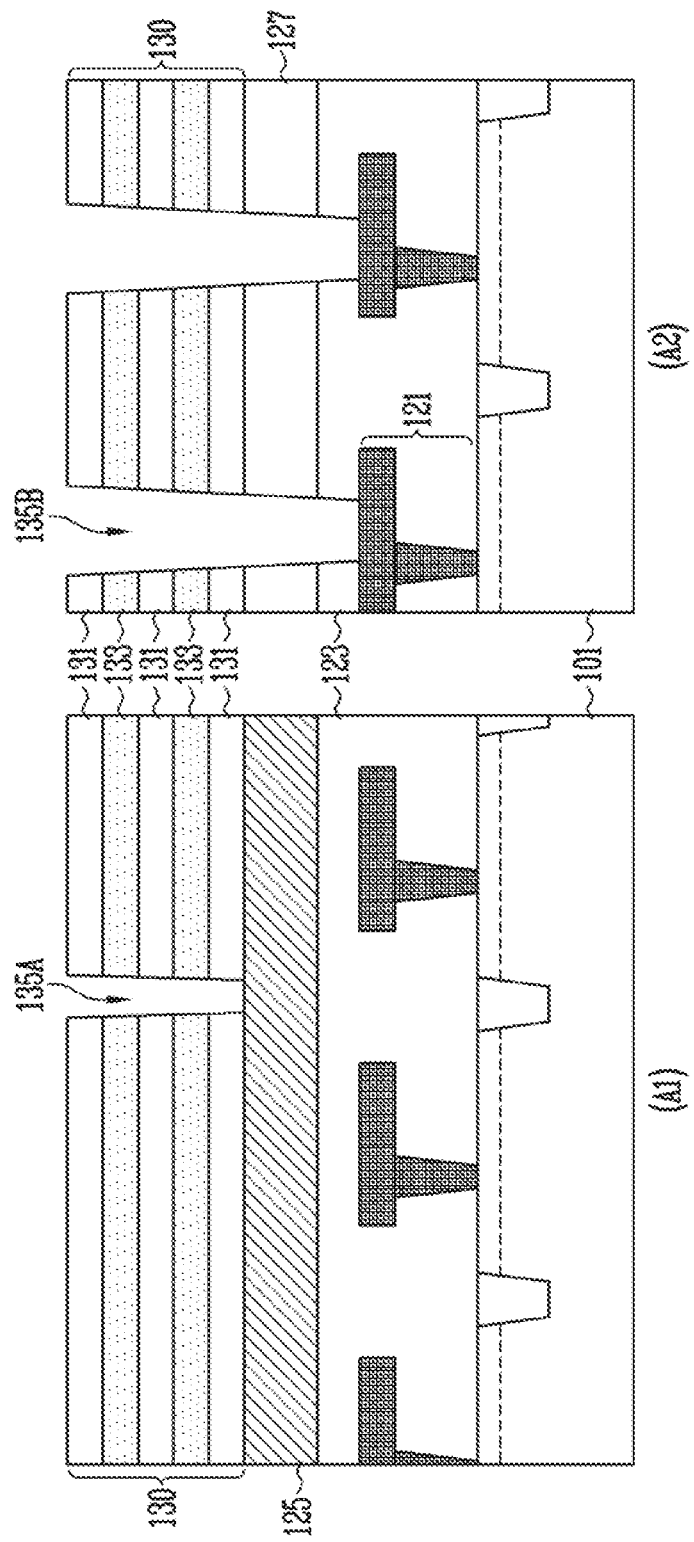

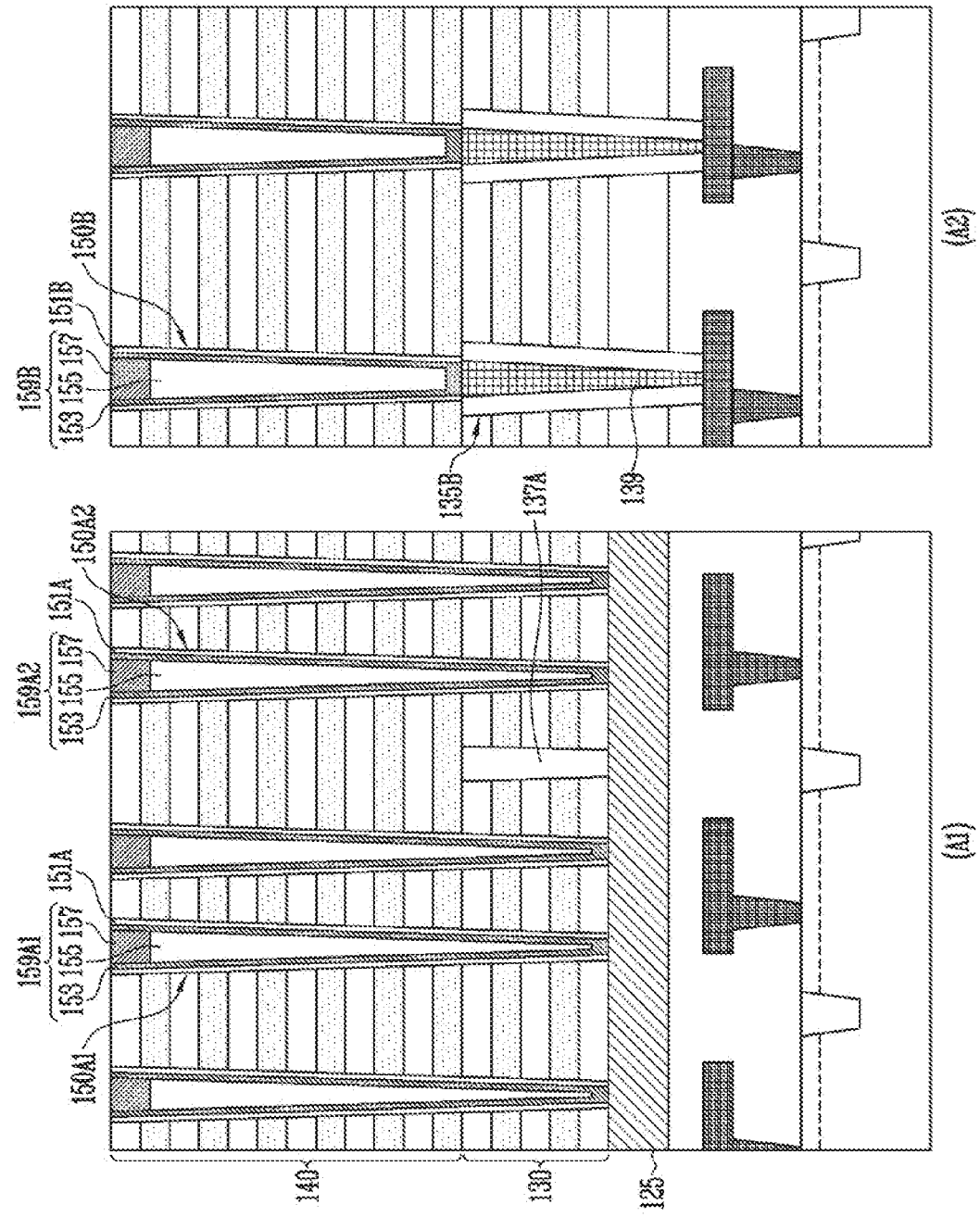

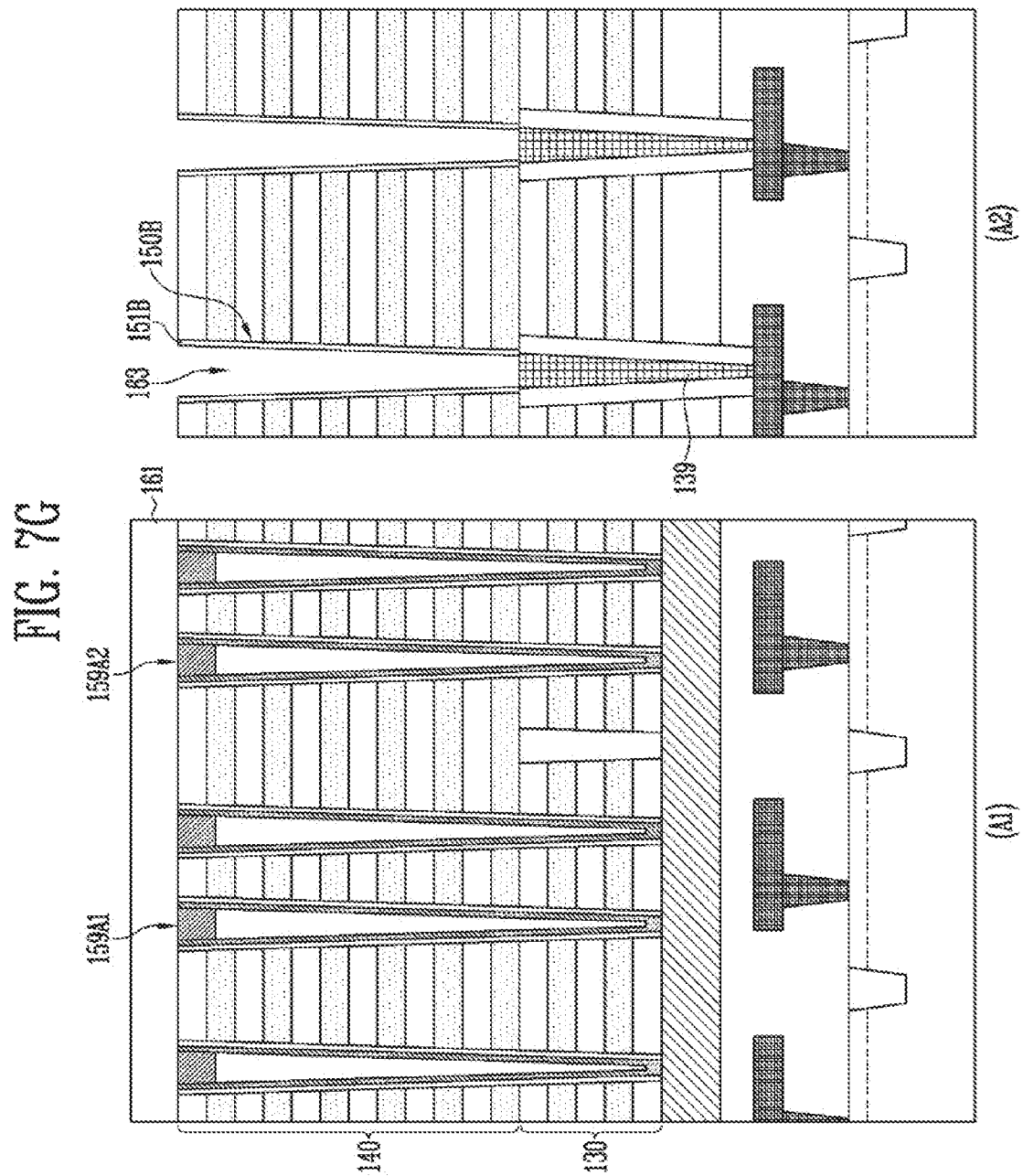

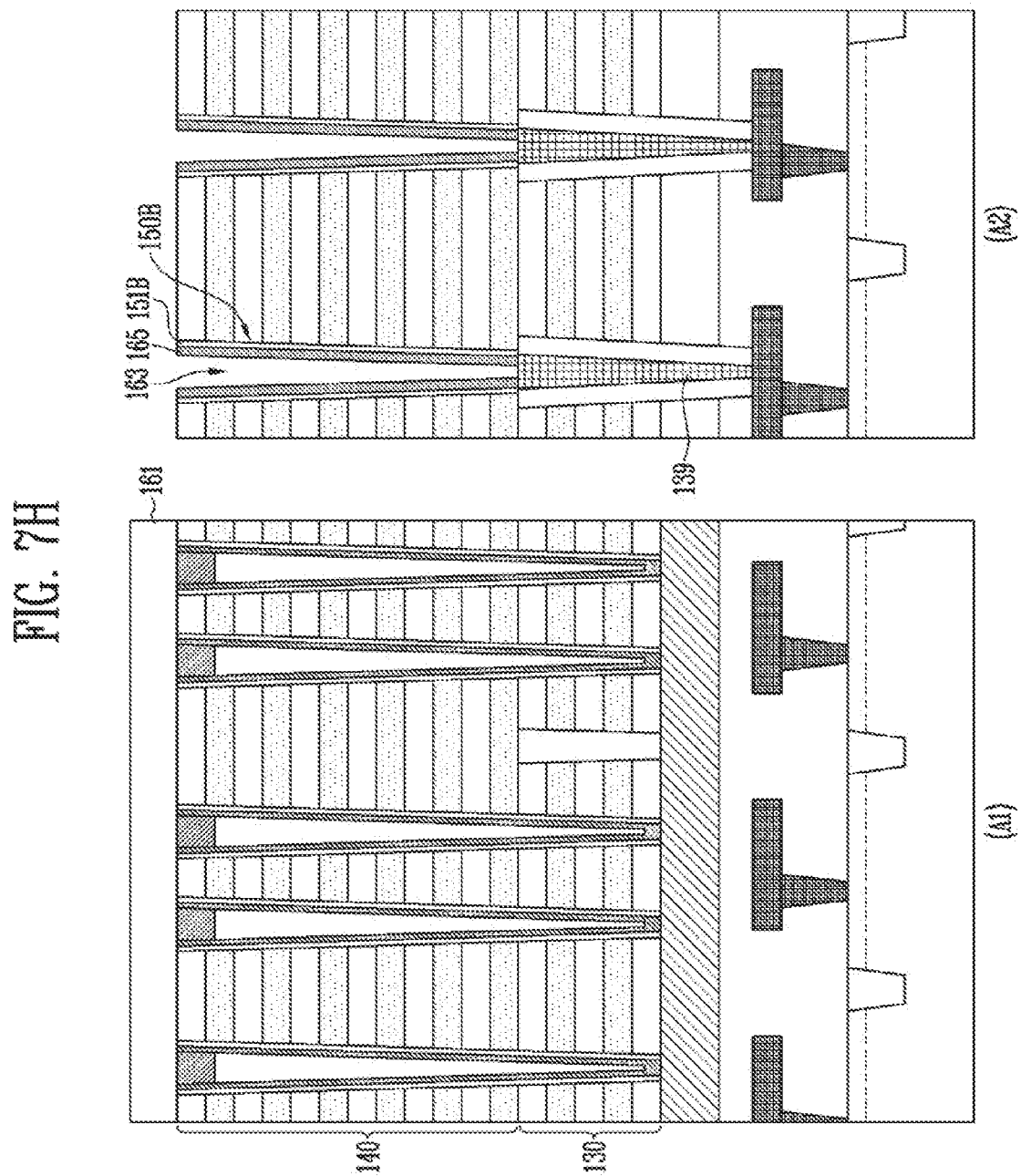

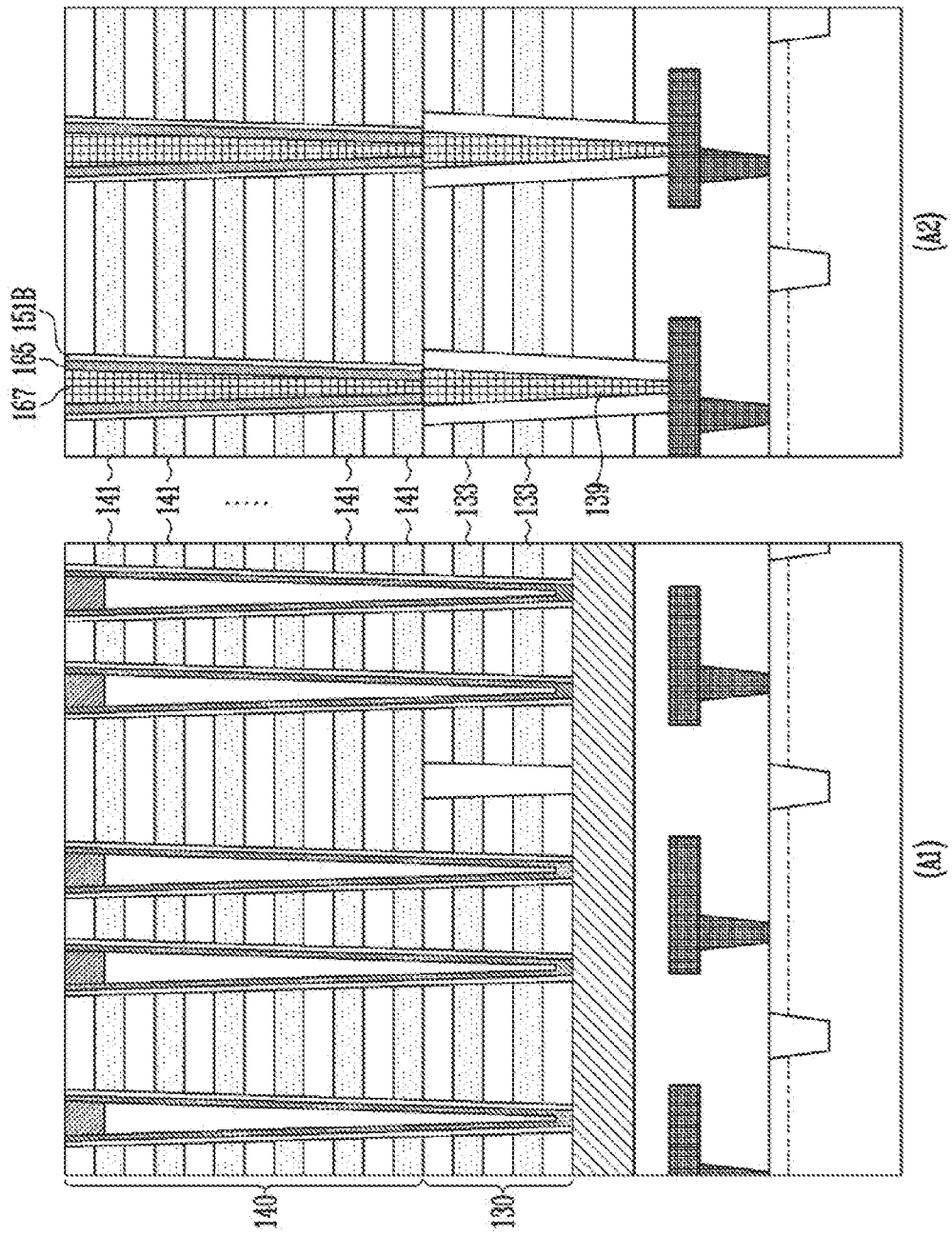

SEMICONDUCTOR MEMORY DEVICE AND MANUFACTURING METHOD THEREOF

CROSS-REFERENCE TO RELATED APPLICATION

The present application claims priority under 35 U.S.C. § 119(a) to Korean patent application number 10-2020-0042389, filed on Apr. 7, 2020, in the Korean Intellectual Property Office, the entire disclosure of that is incorporated herein by reference.

BACKGROUND

1. Technical Field

The present disclosure generally relates to a semiconductor memory device and a manufacturing method thereof, and more particularly, to a three-dimensional semiconductor memory device and a manufacturing method thereof.

2. Related Art

A semiconductor memory device includes a plurality of memory cells that are capable of storing data. The plurality of memory cells may be three-dimensionally arranged to implement a three-dimensional semiconductor memory device. Memory cells are three-dimensionally arranged so that the degree of integration of the memory cells can be improved within a limited area.

SUMMARY

In accordance with an aspect of the present disclosure, there is provided a semiconductor memory device including: a first select group and a second select group isolated from each other by an isolation insulating layer on a plane of a substrate; an upper gate stack structure extending to be parallel to the plane and extending to overlap with the first select group, the isolation insulating layer, and the second select group, the upper gate stack structure including upper conductive patterns and upper interlayer insulating patterns that are alternately stacked in a stacking direction that intersects the plane; channel structures extending to penetrate the first select group, the second select group, and the upper gate stack structure; and a vertical connection structure spaced apart from the first select group, the second select group, and the upper gate stack structure on the plane, the vertical connection structure extending to be parallel to the channel structures, wherein the vertical connection structure includes a first contact pattern that extends toward the substrate from a level at which the isolation insulating layer is disposed and a second contact pattern that extends in the stacking direction from the first contact pattern.

In accordance with another aspect of the present disclosure, there is provided a semiconductor memory device including: a substrate including a peripheral circuit disposed in a first region and a second region and including an interconnection structure that is connected to the peripheral circuit; a first select group and a second select group overlapping with the first region of the substrate, the first select group and the second select group isolated from each other by an isolation insulating layer on a plane that is parallel to the substrate; a first channel structure penetrating the first select group; a second channel structure penetrating the second select group; a lower dummy stack structure overlapping with the second region of the substrate, the lower dummy stack structure being spaced apart from the first select group and the second select group on the plane; a lower contact hole penetrating the lower dummy stack structure, the lower contact hole extending toward the interconnection structure; a first sidewall insulating layer formed on a sidewall of the lower contact hole; and a first contact pattern filling the lower contact hole, surrounded by the first sidewall insulating layer, to be connected to the interconnection structure, wherein a width of the lower contact hole is formed to be wider than that of the isolation insulating layer.

In accordance with still another aspect of the present disclosure, there is provided a method of manufacturing a semiconductor memory device, the method including: forming a lower stack structure on a substrate with a first region and a second region; forming a first slit and a lower contact hole that penetrate the lower stack structure, the first slit overlapping with the first region, the lower contact hole overlapping with the second region; forming an isolation insulating layer that fills the first slit; forming a first sidewall insulating layer that covers a sidewall of the lower contact hole during the forming of the isolation insulating layer; forming a first contact pattern on the first sidewall insulating layer to fill the lower contact hole; forming an upper stack structure on the upper stack structure, the lower stack structure extending to cover the isolation insulating layer and the first contact pattern; forming channel structures that penetrate the upper stack structure and the lower stack structure, the channel structures overlapping with the first region; and forming a second contact pattern that penetrates the upper stack structure, overlapping with the second region, the second contact pattern being connected to the first contact pattern.

BRIEF DESCRIPTION OF THE DRAWINGS

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 7A to 7J are sectional views, illustrating a manufacturing method of a semiconductor memory device in accordance with an embodiment of the present disclosure.

DETAILED DESCRIPTION

Specific structural or functional descriptions disclosed herein are merely illustrative for the purpose of describing embodiments based on the concept of the present disclosure. Embodiments based on the concept of the present disclosure can be implemented in various forms, and should not be construed as being limited to the specific embodiments set forth herein.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Embodiments provide a semiconductor memory device capable of simplifying a manufacturing process, and a manufacturing method of the semiconductor memory device.

Figure 1:
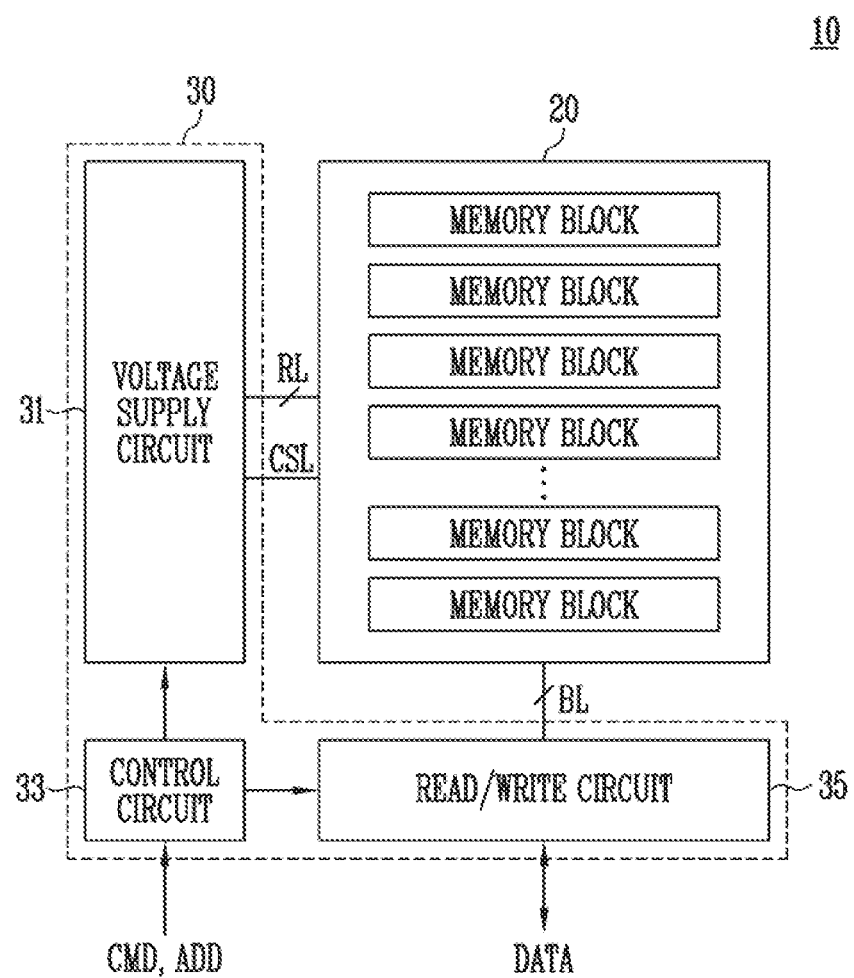
FIG. 1 is a block diagram, illustrating a schematic configuration of a semiconductor memory device in accordance with an embodiment of the present disclosure.

FIG. 1 is a block diagram, illustrating a schematic configuration of a semiconductor memory device 10 in accordance with an embodiment of the present disclosure.

Referring to FIG. 1, the semiconductor memory device 10 may include a memory cell array 20 and a peripheral circuit 30 that are configured to control the memory cell array 20.

The memory cell array 20 may include a plurality of memory blocks. Each of the memory blocks may include a plurality of three-dimensionally arranged memory cells. In an embodiment, the memory blocks may include a plurality of cell strings. Each of the cell strings may include a NAND memory cell. The memory blocks may be connected to the peripheral circuit 30 through local lines RL, a common source line CSL, and bit lines BL.

The peripheral circuit 30 may include a voltage supply circuit 31, a control circuit 33, and a read/write circuit 35. The voltage supply circuit 31 may supply operating voltages that are necessary for an internal operation of the memory cell array 20 through the local lines RL and the common source line CSL. The read/write circuit 35 may be connected to the memory cell array 20 through the bit lines BL.

The control circuit 33 may control the voltage supply circuit 31 to generate voltages that are necessary for an internal operation of the memory cell array 20 in response to a command CMD input from an external device (e.g., a memory controller). The control circuit 33 may control the read/write circuit 35 based on the type of internal operation of the memory cell array 20. The control circuit 33 may output a row address and a column address in response to an address signal ADD input from the external device.

Figure 2:
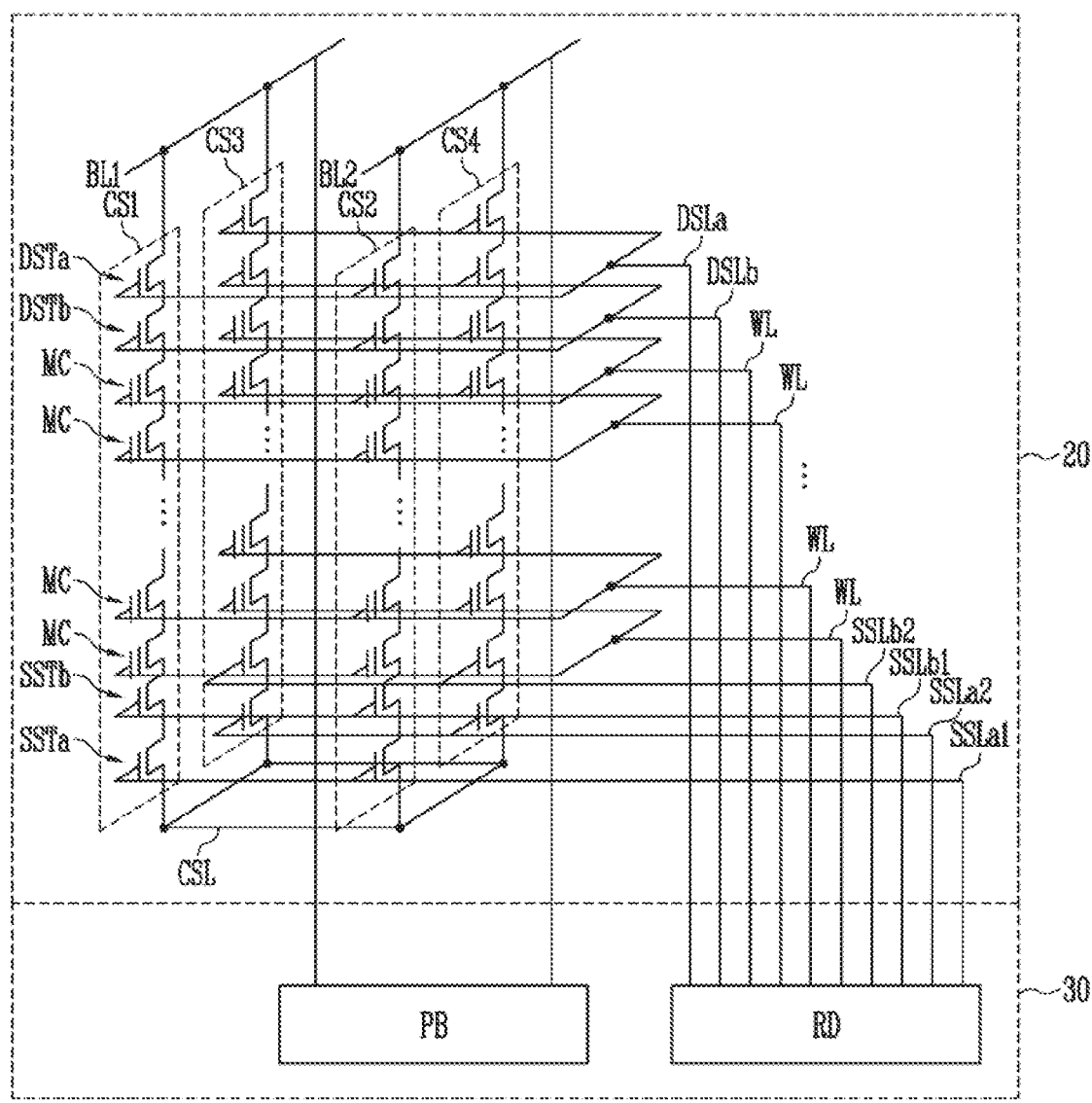
FIG. 2 is a diagram, illustrating a schematic configuration of a memory cell array and a peripheral circuit in accordance with an embodiment of the present disclosure.

The voltage supply circuit 31 may include a row decoder RD as shown in FIG. 2. The row decoder RD may transfer operating voltages to local lines of a memory block selected in the memory cell array 20 in response to a row address signal.

The read/write circuit 35 may select any one of the bit lines BL in response to a column address signal. The read/rite circuit 35 may include a page buffer PB as shown in FIG. 2. The page buffer PB may selectively precharge the bit lines BL based on input data DATA to store data in the memory cells, or sense a current or voltage of the bit lines BL to read data DATA from the memory cells.

FIG. 2 is a diagram, illustrating a schematic configuration of a memory cell array 20 and a peripheral circuit 30 in accordance with an embodiment of the present disclosure.

Referring to FIG. 2, the memory cell array 20 may be disposed on the peripheral circuit 30. Accordingly, the area of a substrate that is occupied by the memory cell array 20 and the peripheral circuit 30 can be reduced.

Each of the memory blocks of the memory cell array 20 may include a common source line CSL, a plurality of cell strings CS1, CS2, CS3, and CS4 that are connected to the common source line CSL, and a plurality of bit lines BL1 and BL2. A plurality of cell strings that are divided into a plurality of column groups may be connected to the common source line CSL. Cell strings of each column group may be connected in parallel to a bit line that corresponds to the column group. In an embodiment, the memory block may include cell strings CS1 and CS3 of a first column group and cell strings CS2 and CS4 of a second column group. The cell strings CS1 and CS3 of the first column group and the cell strings CS2 and CS4 of the second column group may be connected to the common source line CSL. The cell strings CS1 and CS3 of the first column group may be connected in parallel to a first bit line BL1, and the cell strings CS2 and CS4 of the second column group may be connected in parallel to a second bit line BL2.

Each of the cell strings CS1, CS2, CS3, and CS4 may include a source select transistor SSTa, memory cells MC that are connected in series, and a drain select transistor DSTa. Each of the cell strings CS1, CS2, CS3, and CS4 may be connected to the common source line CSL through the source select transistor SSTa and may be connected to a bit line through the drain select transistor DSTa. The memory cells MC of each of the cell strings CS1, CS2, CS3, and CS4 may be connected in series between the source select transistor SSTa and the drain select transistor DSTa. Each of the cell strings CS1, CS2, CS3, and CS4 may further include at least one upper source select transistor SSTb that is connected in series to the source select transistor SSTa. Each of the cell strings CS1, CS2, CS3, and CS4 may further include at least one lower drain select transistor DSTb that is connected in series to the drain select transistor DSTa.

The memory cells of the cell strings CS1, CS2, CS3, and CS4 may be controlled by word lines WL. Gate electrodes of the memory cells MC may be connected to the word lines WL. The word lines WL may be disposed at different levels. Gate electrodes of memory cells MC that are disposed at the same level may be commonly connected to one of the word lines WL. In an embodiment, the cell strings CS1, CS2, CS3, and CS4 may be commonly connected to each of the word lines WL.

In an embodiment, the drain select transistors DSTa of the cell strings CS1, CS2, CS3, and CS4 may be disposed at substantially the same level, and gate electrodes of the drain select transistors DSTa may be commonly connected to a drain select line DSLa. Similarly, the lower drain select transistors DSTb of the cell strings CS1, CS2, CS3, and CS4 may be disposed at substantially the same level, and gate electrodes of the lower drain select transistors DSTb may be commonly connected to a lower drain select line DSLb.

The cell strings CS1, CS2, CS3, and CS4 that are commonly connected to each of the word lines WL and the drain select line DSLa may be controlled by source select lines SSLa1 and SSLa2. In an embodiment, the cell strings CS1, CS2, CS3, and CS4 may include cell strings CS1 and CS2 of a first row group, which are controlled by a first source select line SSLa1, and cell strings CS3 and CS4 of a second row group, which are controlled by a second source select line SSLa2. Source select transistors SSTa of the first row group may be disposed at substantially the same level, and gate electrodes of the source select transistors SSTa of the first row group may be commonly connected to the first source select line SSLa1. Source select transistors SSTa of the second row group may be disposed at substantially the same level, and gate electrodes of the source select transistors SSTa of the second row group may be commonly connected to the second source select line SSLa2. Similarly, upper source select transistors SSTb of the first row group may be disposed at substantially the same level, and gate electrodes of the upper source transistors SSTb of the first row group may be commonly connected to a first upper source select line SSLb1. Upper source select transistors SSTb of the second row group may be disposed at substantially the same level, and gate electrodes of the upper source select transistors SSTb of the second row group may be commonly connected to a second upper source select line SSLb2.

Based on the above-described structure, any one cell string among the cell strings of each column group may be selected under the control of the source select lines.

Each of the drain select line DSLa, the lower drain select line DSLb, the word lines, the first and second source select lines SSLa1 and SSLa2, the first and second upper source select lines SSLb1 and SSLb2, and the first and second bit lines BL1 and BL2 may be connected to the peripheral circuit 30 that is disposed under the memory cell array 20. The row decoder RD of the peripheral circuit 30 may be connected to the drain select line DSLa, the lower drain select line DSLb, the word lines WL, the first and second source select lines SSLa1 and SSLa2, and the first and second upper source select lines SSLb1 and SSLb2. The page buffer PB of the peripheral circuit 30 may be connected to the first and second bit lines BL1 and BL2.

The peripheral circuit 30 may overlap with the memory blocks as shown in FIG. 1. The drain select line DSLa, the lower drain select line DSLb, the word lines WL, the first source select line SSLa1, the second source select line SSLa2, the first upper source select line SSLb1, the second upper source select line SSLb2, the first bit line BL1, and the second bit line BL2 may be connected to the peripheral circuit 30 via vertical connection structures. The vertical connection structures may be disposed between the memory blocks as shown in FIG. 1, may be disposed at both sides of each of the memory blocks as shown in FIG. 1, or may be disposed in a contact region that penetrates each of the memory blocks as shown in FIG. 1.

Figure 3:
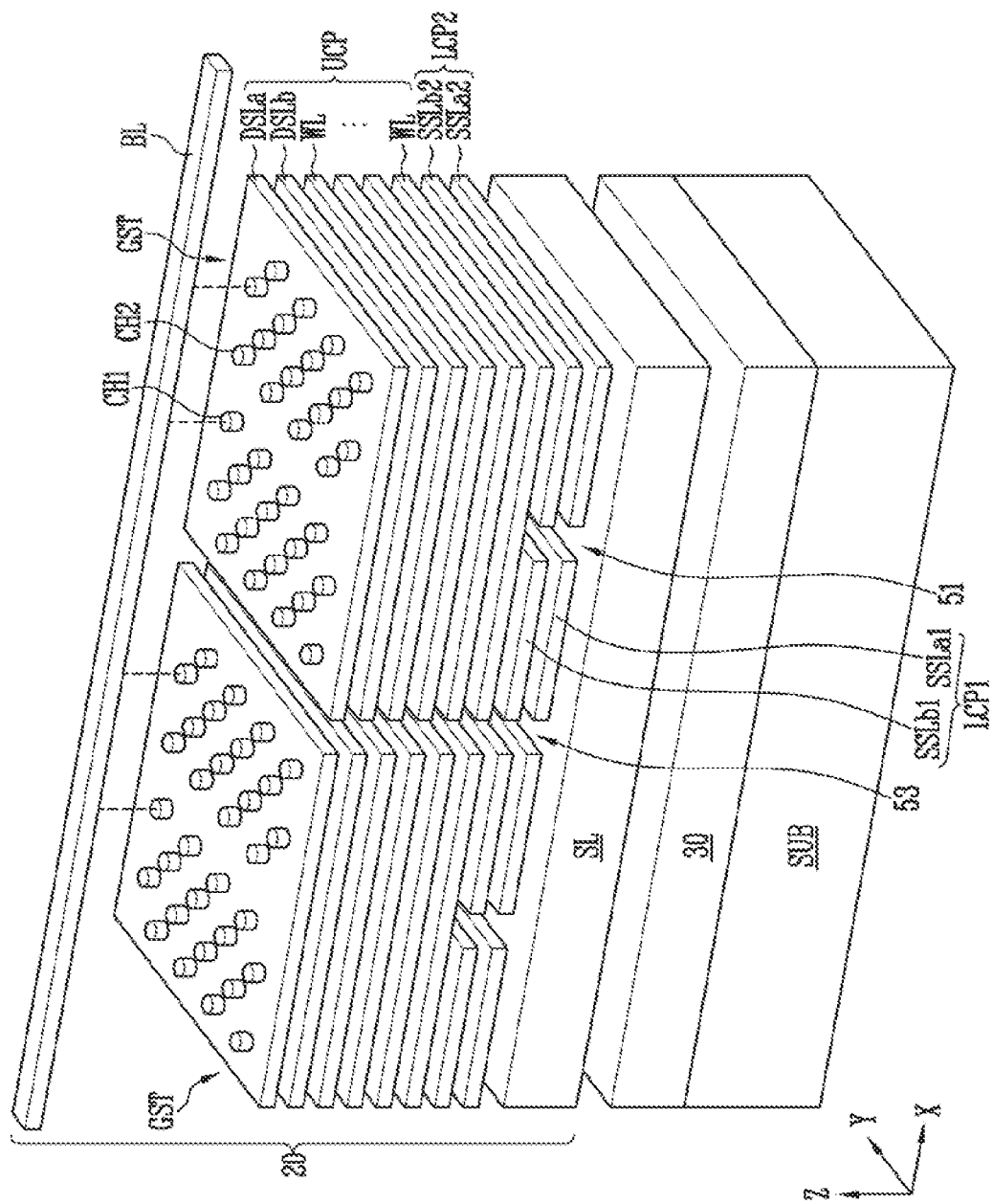
FIG. 3 is a perspective view, illustrating a memory cell array of a semiconductor memory device in accordance with an embodiment of the present disclosure.

FIG. 3 is a perspective view, illustrating a memory cell array 20 of a semiconductor memory device in accordance with an embodiment of the present disclosure.

The memory cell array 20 may overlap with a substrate SUB with a peripheral circuit 30. The memory cell array 20 may include a source layer SL constituting the common source line CSL as shown in FIGS. 1 and 2, gate stack structures GST that are disposed on the source layer SL to be spaced apart from each other, channel structures CH1 and CH2 that penetrate each of the gate stack structures GST, and a bit line BL that is electrically connected to the channel structures CH1 and CH2.

Each of the gate stack structures GST may include first lower conductive patterns LCP1, second lower conductive patterns LCP2, and upper conductive patterns UCP. The first lower conductive patterns LCP1 may be isolated from the second lower conductive patterns LCP2 with a first slit 51 that is interposed therebetween. Each of the upper conductive patterns UCP may extend to overlap with the first slit 51, the first lower conductive patterns LCP1, and the second lower conductive patterns LCP2. The gate stack structures GST may be spaced apart from each other on a plane (hereinafter, referred to as an 'X-Y plane') that is parallel to the substrate SUB with a second slit 53 that is interposed therebetween.

On the X-Y plane, the second lower conductive patterns LCP2 may be spaced apart from the first lower conductive patterns LCP1. The first lower conductive patterns LCP1 may include a first source select line SSLa1 and at least one first upper source select line SSLb1. The first upper source select line SSLb1 may be stacked on the first source select line SSLa1. The second lower conductive patterns LCP2 may include a second source select line SSLa2 that is disposed at substantially the same level as the first source select line SSLa1 and a second upper source select line SSLb2 that is disposed at substantially the same level as the first upper source select line SSLb1.

The upper conductive patterns UCP may include a plurality of word lines WL, at least one lower drain select line DSLb, and a drain select line DSLa, which are stacked in a stacking direction (hereinafter, referred to as a 'Z direction') intersecting the X-Y plane.

The channel structures CH1 and CH2 may include first channel structures CH1 that penetrate the upper conductive patterns UCP and the first lower conductive patterns LCP1 and second channel structures CH2 that penetrate the upper conductive patterns UCP and the second lower conductive patterns LCP2.

The first channel structures CH1 or the second channel structures CH2 may be arranged in a matrix pattern or a zigzag pattern on the X-Y plane. The bit line BL may be connected to a pair of first and second channel structures CH1 and CH2, which correspond to the bit line BL. Although not shown in the drawing, contact plugs may be disposed between the bit line BL and the pair of first and second channel structures CH1 and CH2 so that the bit line BL may be connected to the pair of first and second channel structures CH1 and CH2 via the contact plugs.

Figure 4:
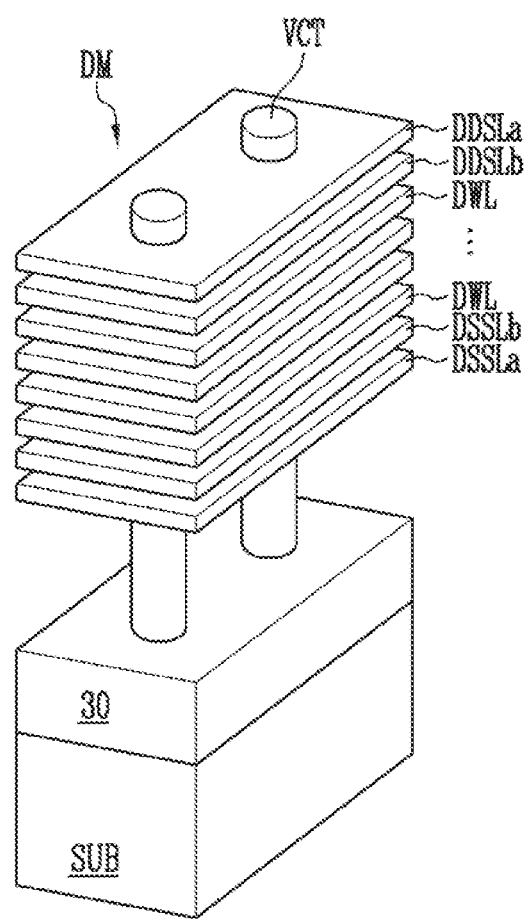
FIG. 4 is a perspective view, illustrating a vertical connection structure of a semiconductor memory device in accordance with an embodiment of the present disclosure.

FIG. 4 is a perspective view, illustrating a vertical connection structure VCT of a semiconductor memory device in accordance with an embodiment of the present disclosure.

A substrate SUB with a peripheral circuit 30 may extend to overlap with the vertical connection structure VCT. In an embodiment, the vertical connection structure VCT may be connected to one of the drain select line DSLa, the lower drain select line DSLb, the word lines WL, the first source select line SSLa1, the second source select line SSLa2, the first upper source select line SSLb1, the second upper source select line SSLb2, and the bit line BL via an upper line (not shown). The vertical connection structure VCT may be connected to one of the page buffer PB and the row decoder RD, which are shown in FIG. 2. In an embodiment, the vertical connection structure VCT may electrically connect a signal line that is disposed above the vertical connection structure VCT to the peripheral circuit 30. The peripheral circuit 30 that is connected to the vertical connection structure VCT is not limited to the page buffer PB and the row decoder RD, which are shown in FIG. 2.

The vertical connection structure VCT may penetrate a dummy stack structure DM and may be connected to the peripheral circuit 30. The dummy stack structure DM may be spaced apart from the gate stack structures GST as shown in FIG. 3. The dummy stack structure DM may include lower dummy conductive patterns DSSLa and DSSLb and upper dummy conductive patterns DWL, DDSLa, and DDSLb. The lower dummy conductive patterns DSSLa and DSSLb may be respectively disposed at substantially the same levels as the first lower conductive patterns LCP1 and the second lower conductive patterns LCP2, which are shown in FIG. 3. The upper dummy conductive patterns DWL, DDSLa, and DDSLb may be respectively disposed at substantially the same levels as the upper conductive patterns UCP.

Hereinafter, a region of the substrate SUB, which overlaps with the gate stack structures GST, shown in FIG. 3, is defined as a first region, and a region of the substrate SUB, which overlaps with the dummy stack structure, shown in FIG. 4, is defined as a second region.

FIGS. 5A to 5E are views, illustrating a structure of a semiconductor memory device in accordance with an embodiment of the present disclosure.

Figure 5A:
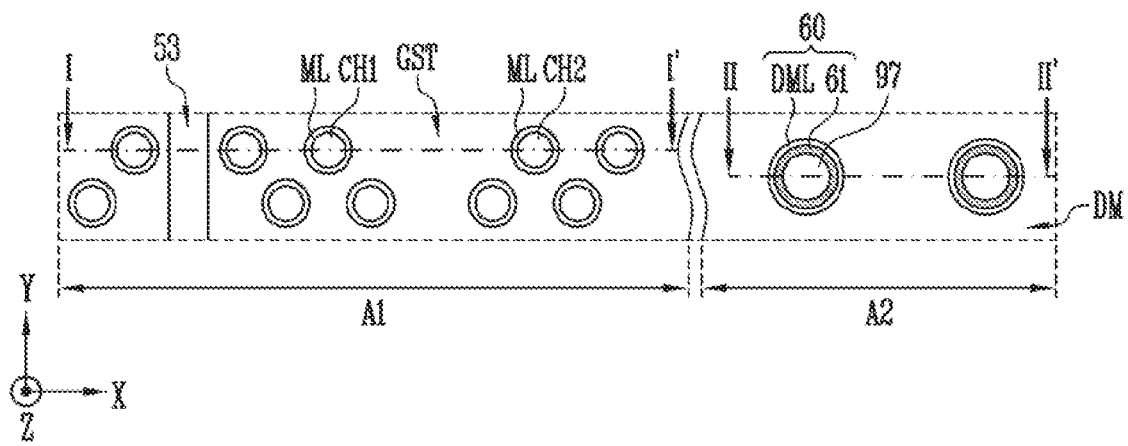
FIGS. 5A to 5E are views, illustrating a structure of a semiconductor memory device in accordance with an embodiment of the present disclosure.

FIG. 5A is a plan view, illustrating gate stack structures GST that overlap with a first region A1 of a substrate and a dummy stack structure DM that overlaps with a second region A2 of the substrate. FIG. 5A illustrates a case where the gate stack structures GST and the dummy stack structure DM are arranged in an X direction, but the present disclosure is not limited thereto. In an embodiment, the dummy stack structure DM may be arranged to be adjacent to an end portion of each of the gate stack structures GST in a Y direction.

Referring to FIG. 5A, each of the gate stack structures GST at both sides of a second slit 53 may surround a first channel structure CH1 and a second channel structure CH2. The first channel structure CH1 and the second channel structure CH2 may be respectively surrounded by memory layers ML.

The dummy stack structure DM may be penetrated by the vertical connection structure VCT. As shown in FIG. 5D, the vertical connection structure VCT may include a first contact pattern 87 and a second contact pattern 97. A sidewall of the first contact pattern 87 may be surrounded by a first sidewall insulating layer 85 as shown in FIG. 5D, and the second contact pattern 97 may be surrounded by a second sidewall insulating layer 60 as shown in FIG. 5D. As shown in FIG. 5A, the second sidewall insulating layer 60 may include an inner insulating layer 61 that surrounds a sidewall of the second contact pattern 97 and a dummy memory layer DML that surrounds the inner insulating layer 61.

The gate stack structures GST and the dummy stack structure DM may be spaced apart from each other on the X-Y plane. The memory layers ML, the first channel structure CH1, the second channel structure CH2, the second sidewall insulating layer 60 and the second contact pattern 97 may extend in a Z direction.

Figure 5B:
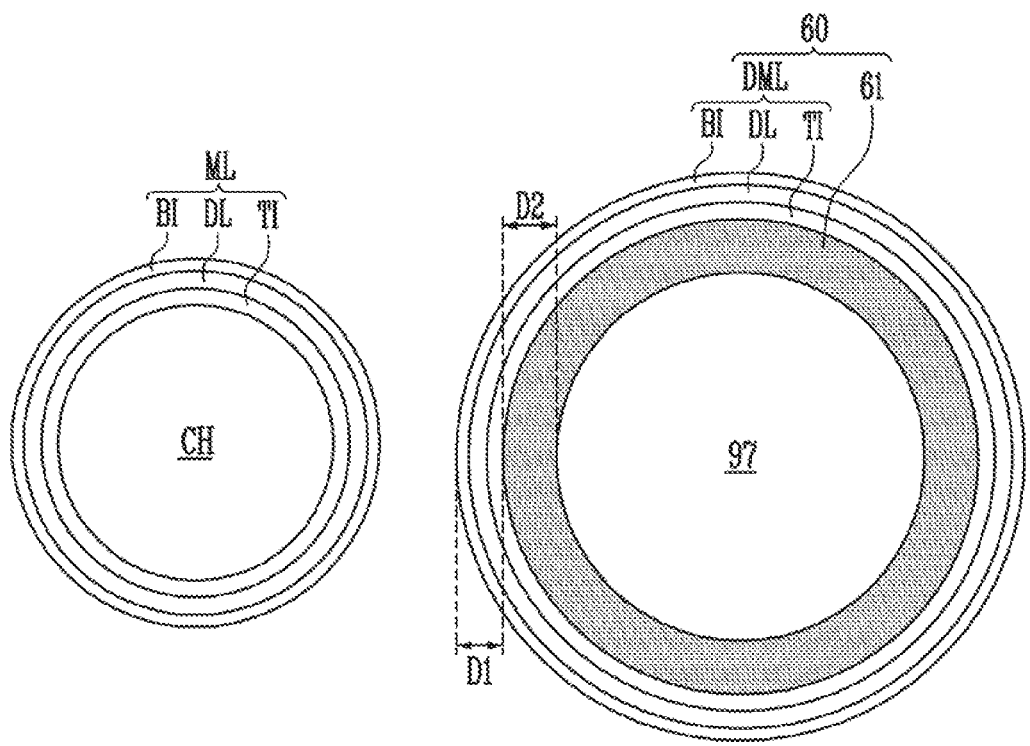

FIG. 5B shows enlarged views, illustrating a cross-section of the memory layer ML that surrounds a channel structure CH and a cross-section of the second sidewall insulating layer 60 that surrounds the second contact pattern 97. Each of the first channel structure CH1 and the second channel structure CH2, which are shown in FIG. 5A, may correspond to the channel structure CH as shown in FIG. 5B.

Referring to FIG. 5B, the memory layer ML may include a data storage layer DL for storing data. In an embodiment, the data storage layer DL may include a nitride layer in which charges can be trapped. However, the embodiment of the present disclosure is not limited thereto, and the data storage layer DL may include silicon, a phase change material, nano dots, etc. The memory layer ML may include a tunnel insulating layer TI surrounded by the data storage layer DL and a blocking insulating layer BI that surrounds the data storage layer DL. The blocking insulating layer BI may include an oxide layer capable of blocking charges. The tunnel insulating layer TI may be formed of a silicon oxide layer through that charges can tunnel.

The dummy memory layer DML may include the same material layers as the memory layer ML. In an embodiment, the dummy memory layer DML may include a tunnel insulating layer TI, a data storage layer DL that surrounds the tunnel insulating layer TI, and a blocking insulating layer BI that surrounds the data storage layer DL.

The inner insulating layer 61 may include oxide. The inner insulating layer 61 may enhance insulation characteristics between the dummy stack structure DM and the second contact pattern 97, which are shown in FIG. 5A. A thickness D2 of the inner insulating layer 61 may be formed to be thicker than that D1 of the dummy memory layer DML.

Figure 5C:
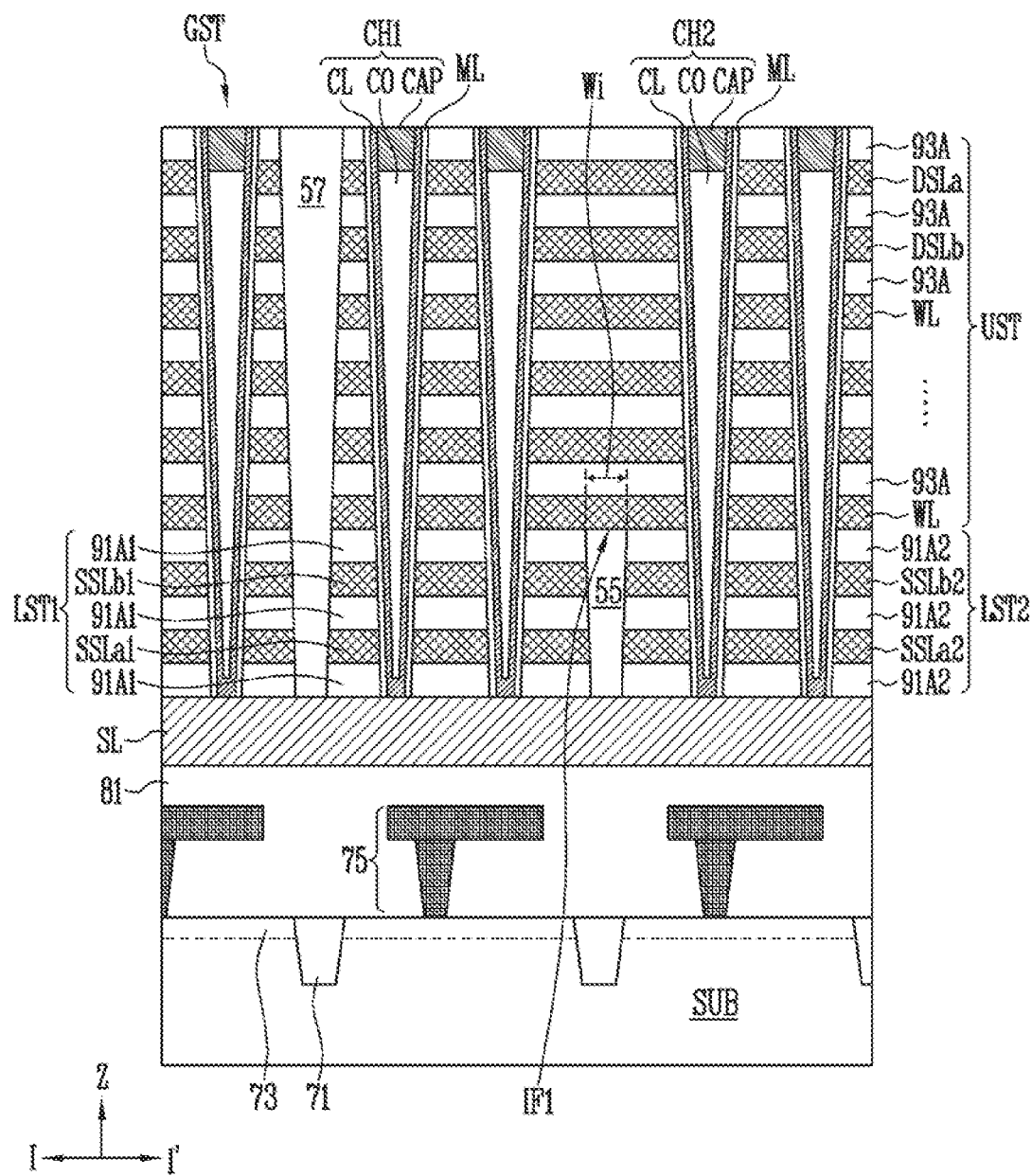
Figure 5D:
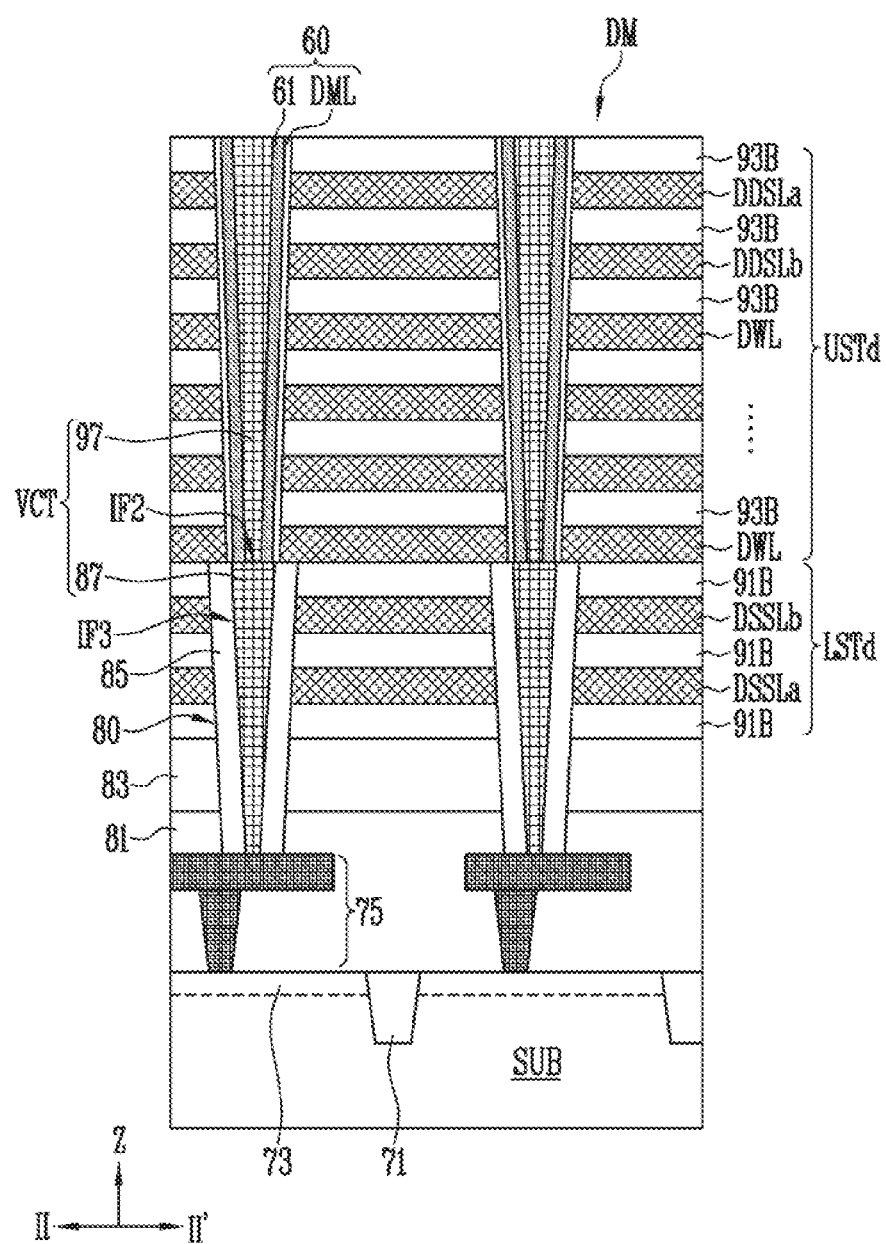

FIG. 5C is a sectional view that is taken along line I-I' as shown in FIG. 5A, and FIG. 5D is a sectional view taken along line as shown in FIG. 5A.

Referring to FIGS. 5C and 5D, A substrate SUB may include elements constituting a peripheral circuit. In an embodiment, the substrate SUB may include impurity regions 73 respectively formed in active regions defined by isolation layers 71. The impurity regions 73 may include at least one of a p-type impurity and an n-type impurity. The impurity regions 73 may provide for source regions and drain regions of transistors included in the page buffer PB and the row decoder RD, which are shown in FIG. 2.

The peripheral circuit of the substrate SUB may be connected to interconnection structures 75. In an embodiment, the interconnection structures 75 may be connected to the impurity regions 73. Each of the interconnection structures 75 may include a via plug, a pad pattern, and a lower metal line, which are formed of a conductive material and are connected to each other.

The substrate SUB with the peripheral circuit and the interconnection structures 75 may be covered by a first lower insulating layer 81. The first lower insulating layer 81 may include multi-layered insulating layers each with two or more layers. The first lower insulating layer 81 may extend to overlap with the first region A1 and the second region A2 of the substrate SUB.

A source layer SL and a second lower insulating layer 83 may overlap with the first lower insulating layer 81. The source layer SL and the second lower insulating layer 83 may be disposed at substantially the same level.

The source layer SL may be disposed under the gate stack structure GST. The source layer SL may overlap with the first region A1 of the substrate SUB as shown in FIG. 5A to be connected to the first channel structure all and the second channel structure CH2. The source layer SL may include a doped semiconductor layer. In an embodiment, the source layer SL may include n-type doped silicon.

The second lower insulating layer 83 may be disposed between the dummy stack structure DM and the first lower insulating layer 81. The second lower insulating layer 83 may include oxide.

The gate stack structures GST may be spaced apart from each other with a vertical structure 57 that is interposed therebetween. The vertical structure 57 may fill the second slit 53 as shown in FIG. 5A. The vertical structure 57 may include an insulating material or include an insulating material and a conductive plug that penetrates the insulating material.

Each of the gate stack structures GST may include a first select group LST1, a second select group LST2, an isolation insulating layer 55 and an upper gate stack structure UST. The first select group ST1 and the second select group LST2 may be isolated from each other on the X-Y plane. The isolation insulating layer 55 may be disposed between the first select group LST1 and the second select group LST2. The upper gate stack structure UST may extend in parallel to the X-Y plane to overlap with the first select group LST1, the second select group LST2, and the isolation insulating layer 55.

The first select group LST1 may include first lower interlayer insulating patterns 91A1 and first lower conductive patterns (e.g., a first source select line SSLa1 and a first upper source select line SSLb1), which are alternately stacked in the Z direction. The second select group LST2 may include second lower interlayer insulating patterns 91A2 and second lower conductive patterns (e.g., a second source select line SSLa2 and a second upper source select line SSLb2), which are alternately stacked in the Z direction.

The upper gate stack structure UST may include upper conductive patterns (e.g., word lines WL, a lower drain select line DSLb, and a drain select line DSLa) and upper interlayer insulating patterns 93A, which are alternately stacked in the Z direction. Each of the word lines WL, the lower drain select line DSLb, the drain select line DSLa, and the upper interlayer insulating patterns 93A may extend in parallel to an X-Y plane to overlap with the first select group LST1, the second select group LST2, and the isolation insulating layer 55.

The first channel structure CH1 may be in contact with the source layer SL and may extend in the Z direction to penetrate the upper gate stack structure UST and the first select group LST1. The memory layer ML that surrounds the first channel structure CH1 may extend along a sidewall of the first channel structure CH1. The second channel structure CH2 may be in contact with the source layer SL and may extend in the Z direction to penetrate the upper gate stack structure UST and the second select group LST2. The memory layer ML that surrounds the second channel structure CH2 may extend along a sidewall of the second channel structure CH2. Each of the first channel structure CH1 and the second channel structure CH2 may include a channel layer CL, a core insulating layer CO, and a capping semiconductor layer CAP. The core insulating layer CO and the capping semiconductor layer CAP may be disposed in a central region of a channel structure CH1 or CH2. The capping semiconductor layer CAP may be disposed on the core insulating layer CO. The channel layer CL may extend along a sidewall and a bottom surface of the core insulating layer CO and may extend to surround the capping semiconductor layer CAP. However, the present disclosure is not limited thereto. For example, the core insulating layer CO may be omitted, and the central region of the channel structure CH may be filled with the channel layer CL. The capping semiconductor layer CAP may include doped silicon. In an embodiment, the capping semiconductor layer CAP may include an n-type impurity.

The vertical connection structure VCT may be spaced apart from the first select group LST1, the second select group LST2, and the upper gate stack structure UST on an X-Y plane, and may extend in parallel to the first channel structure CH1 and the second channel structure CH2. The first contact pattern 87 of the vertical connection structure VCT may extend toward the substrate SUB from a level at which the isolation insulating layer 55 is disposed. The second contact pattern 97 of the vertical connection structure VCT may extend from the first contact pattern 87 in the Z direction. An interface IF2 between the first contact pattern 87 and the second contact pattern 97 may be disposed at substantially the same level as that IF1 between the isolation insulating layer 55 and the upper gate stack structure UST. In other words, the interface IF2 between the first contact pattern 87 and the second contact pattern 97 may be disposed at substantially the same level as a level at which the isolation insulating layer 55 and the upper gate stack structure UST are connected. An interface IF3 between the first sidewall insulating layer 85 and the first contact pattern 87 may be covered by the second sidewall insulating layer 60.

The vertical connection structure VCT may be surrounded by the dummy stack structure DM. The dummy stack structure DM may include a lower dummy stack structure LSTd on the second lower insulating layer 83 and an upper dummy stack structure USTd on the lower dummy stack structure LSTd.

The lower dummy stack structure LSTd may include lower dummy interlayer insulating patterns 91B and lower dummy conductive patterns DSSLa and DSSLb, which surround the first contact pattern 87 and are alternately stacked in the Z direction. The lower dummy stack structure LSTd may be disposed at substantially the same level as the first select group LST1 and the second select group LST2.

The lower dummy stack structure LSTd may be penetrated by a lower contact hole 80. The lower contact hole 80 may overlap with any one of the interconnection structures 75. The lower contact hole 80 may penetrate the first lower insulating layer 81 and the second lower insulating layer 83 and reach a top surface of an interconnection structure 75 that corresponds to the lower contact hole 80. The first sidewall insulating layer 85 may be formed on a sidewall of the lower contact hole 80. The first contact pattern 87 may be formed to fill the lower contact hole 80 on the first sidewall insulating layer 85. The first contact pattern 87 may be formed of a conductive material and may be connected to an interconnection structure 75 that corresponds to the first contact pattern 87. The first contact pattern 87 may be connected to the peripheral circuit 30 as shown in FIGS. 1 to 4 via the interconnection structure 75 that corresponds to the first contact pattern 87.

The upper dummy stack structure USTd may include upper dummy interlayer insulating patterns 93B and upper dummy conductive patterns DWL, DDSLa, and DDSLb, which surround the second contact pattern 97 and are alternately stacked in the Z direction. The upper dummy stack structure USTd may be disposed at substantially the same level as the upper gate stack structure UST.

The upper dummy stack structure USTd may be insulated from the second contact pattern 97 through the second sidewall insulating layer 60. The second contact pattern 97 may be connected to the interconnection structure 75 via the first contact pattern 87.

Figure 5E:
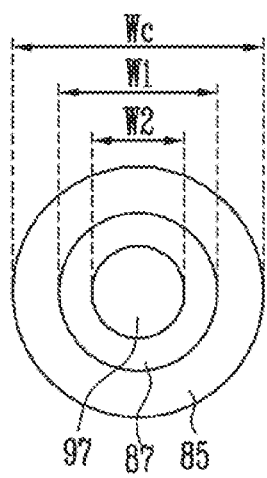

FIG. 5E illustrates a cross-section of each of the first contact pattern 87, the second contact pattern 97, and the first sidewall insulating layer 85, taken along the interface IF2 at which the first contact pattern 87 and the second contact pattern 97 are in contact with each other.

Referring to FIG. 5E, the width Wc of the lower contact hole 80 that is defined along the outer circumference of the first sidewall insulating layer 85 may be formed to be wider than that Wi of the isolation insulating layer 55 as shown in FIG. 5C. In an embodiment, the width Wc of the lower contact hole 80 may be two times or more of the width Wi of the isolation insulating layer 55.

The first contact pattern 87 and the second contact pattern 97 may have different widths at a level at which the interface IF1, shown in FIG. 5C, is disposed. At the level at which the interface IF1, shown in FIG. 5C, is disposed, the first contact pattern 87 may have a first width W1, and the second contact pattern 97 may have a second width W2 that is narrower than the first width W1.

The first contact pattern 87 and the second contact pattern 97 of the vertical connection structure VCT, which are described with reference to FIGS. 5A to 5E, are formed through an individual process, and thus, the level of difficulty of processes may be lowered even when the height of the vertical connection structure VCT that extends in the Z direction is increased.

The lower contact hole 80, the first sidewall insulating layer 85, the first contact pattern 87, the second sidewall insulating layer 60, and the second contact pattern 97 may be formed by using a process to form a memory cell array, and thus, a manufacturing process of the semiconductor memory device may be simplified.

Figure 6A:
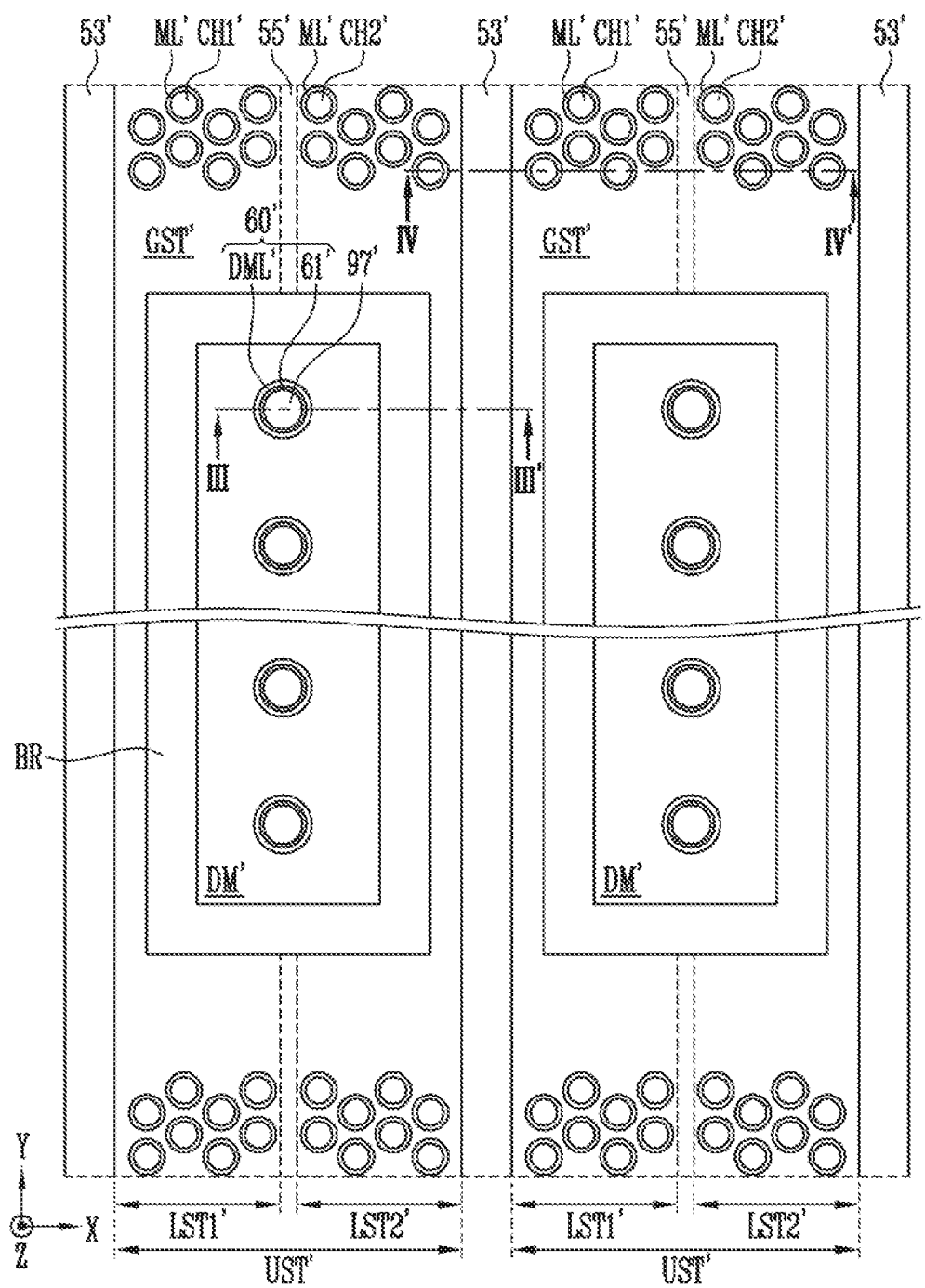
FIGS. 6A and 6B are views, illustrating a structure of a semiconductor memory device in accordance with an embodiment of the present disclosure.
Figure 6B:
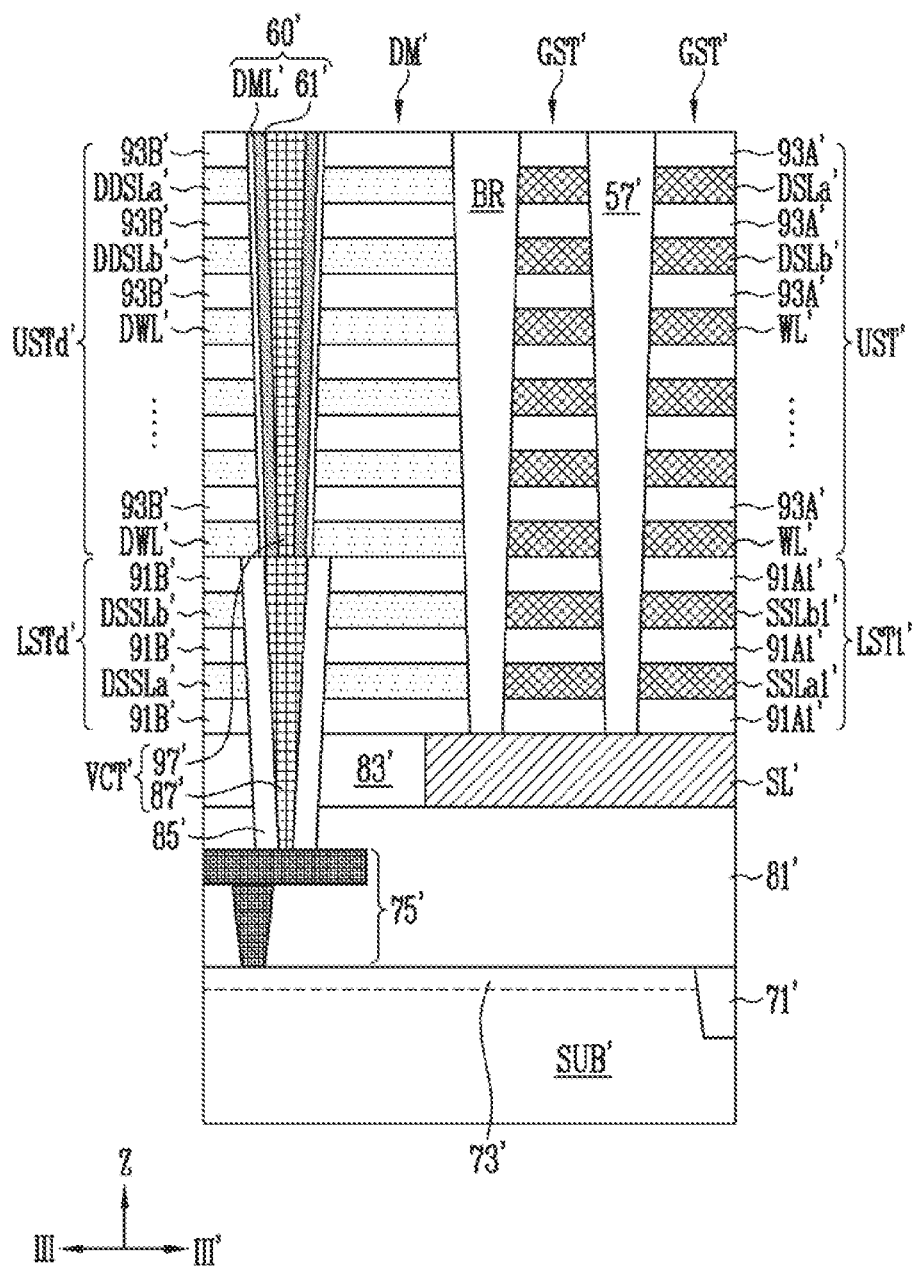

FIGS. 6A and 6B are views, illustrating a structure of a semiconductor memory device in accordance with an embodiment of the present disclosure. Hereinafter, descriptions of portions that overlap with those described with FIGS. 5A to 5E will be omitted.

FIG. 6A is a plan view, illustrating gate stack structures GST' and dummy stack structures DM'.

Referring to FIG. 6A, the dummy stack structures DM' may be respectively surrounded by the gate stack structures GST'. A barrier insulating layer BR may be disposed along each of interfaces between the dummy stack structures DM' and the gate stack structures GST'.

Each of the gate stack structures GST' may include a first select group LST1', a second select group LST2', an isolation insulating layer 55', and an upper gate stack structure UST'. The first select group LST1' and the second select group LST2' may be isolated from each other on an X-Y plane. The isolation insulating layer 55' may be disposed between the first select group LST1' and the second select group LST2'. The upper gate stack structure UST' may extend in parallel to an X-Y plane to overlap with the first select group LST1', the second select group LST2', and the isolation insulating layer 55'.

The isolation insulating layer 55' may be structurally connected to the barrier insulating layer BR.

The first select group LST1' may extend to surround one side of the barrier insulating layer BR, and the second select group LST2' may extend to surround the other side of the barrier insulating layer BR.

The upper gate stack structure UST' may extend to surround an outer wall of the barrier insulating layer BR.

Each of the gate stack structures GST' may be penetrated by a first channel structure CH1' and a second channel structure CH2', which are surrounded by memory layers ML'. The first channel structure CH1' and the second channel structure CH2' may be respectively disposed at both sides of the isolation insulating layer 55'.

The dummy stack structure DM' may be penetrated by a vertical connection structures VCT' as shown in FIG. 6B. The vertical connection structure VCT' may include a first contact pattern 87' and a second contact pattern 97' as shown in FIG. 6B. A sidewall of the first contact pattern 87' may be surrounded by a first sidewall insulating layer 85' as shown in FIG. 6B, and the second contact pattern 97' may be surrounded by a second sidewall insulating layer 60' as shown in FIG. 6B. As shown in FIG. 6A, the second sidewall insulating layer 60' may include an inner insulating layer 61' that surrounds a sidewall of the second contact pattern 97' and a dummy memory layer DML' that surrounds the inner insulating layer 61'.

FIG. 6B is a sectional view taken along line as shown in FIG. 6A. A sectional view taken along line IV-IV' as shown in FIG. 6A is identical to that as shown in FIG. 5C.

Referring to FIG. 6B, a substrate SUB' may include elements constituting a peripheral circuit. In an embodiment, the substrate SUB' may include an impurity region 73' formed in an active region defined by an isolation layer 71'.

The impurity region 73' constituting the peripheral circuit may be connected to an interconnection structure 75'. The interconnection structure 75' and the substrate SUB' with the peripheral circuit may be covered by a first lower insulating layer 81'.

A source layer SL' and a second lower insulating layer 83' may be disposed at substantially the same level, and overlap with the first lower insulating layer 81'.

Each of the gate stack structures GST' may be disposed on the source layer SL'. A vertical structure 57' between the gate stack structures GST' may overlap with the source layer SL'. The vertical structure 57' is a component filling a second slit 53' as shown in FIG. 6A, and include an insulating material or include an insulating material and a conductive plug that penetrate the insulating material.

The source layer SL' may extend to overlap with the barrier insulating layer BR. The barrier insulating layer BR may be disposed between the gate stack structure GST' and the dummy stack structure DM'.

The dummy stack structure DM' may surround the vertical connection structure VCT'. The dummy stack structure DM' may include a lower dummy stack structure LSTd' on the second lower insulating layer 83' and an upper dummy stack structure USTd' on the lower dummy stack structure LSTd'.

The lower dummy stack structure LSTd' may include a lower dummy interlayer insulating patterns 91B' and lower sacrificial insulating patterns DSSLa' and DSSLb', which surround the first contact pattern 87' and are alternately stacked in a Z direction. The lower dummy stack structure LSTd' may be disposed at substantially the same level as the first select group LST1'. The first select group LST1' may include first lower interlayer insulating patterns 91A' and first lower conductive patterns (e.g., a first source select line SSLa1' and a first upper source select line SSLb1'), which are alternately stacked in the Z direction. The lower dummy interlayer insulating patterns 91B' may be respectively disposed at substantially the same levels as the first lower interlayer insulating patterns 91A1'. The lower sacrificial insulating patterns DSSLa' and DSSLb' may be respectively disposed at substantially the same levels as the first source select line SSLa1' and the first upper source select line SSLb1'.

The first contact pattern 87' of the vertical connection structure VCT' may penetrate the first lower insulating layer 81' and the second lower insulating layer 83' and reach a top surface of the interconnection structure 75'. The sidewall of the first contact pattern 87' may be surrounded by the first sidewall insulating layer 85'.

The upper dummy stack structure USTd' may include upper dummy interlayer insulating patterns 93B' and upper sacrificial insulating patterns DWL', DDSLa', and DDSLb', which surround the second contact pattern 97' and are alternately stacked in the Z direction. The upper dummy stack structure USTd' may be disposed at substantially the same level as the upper gate stack structure UST'. The upper gate stack structure UST' may include upper conductive patterns (e.g., word lines WL', a lower drain select line Dab', and a drain select line DSLa') and upper interlayer insulating patterns 93A', which are alternately stacked in the Z direction. The upper dummy interlayer insulating patterns 93B' may be respectively disposed at substantially the same levels as the upper interlayer insulating patterns 93A'. The upper sacrificial insulating patterns DWL', DDSLa', and DDSLb' may be respectively disposed at substantially the same levels as the word lines WL', the lower drain select line DSLb', and the drain select line DSLa'.

The upper interlayer insulating patterns 93A', the first lower interlayer insulating patterns 91A1', the lower dummy interlayer insulating patterns 91B', and the upper dummy interlayer insulating patterns 93B' may be formed of the same material. The lower sacrificial insulating patterns DSSLa' and DSSLb' and the upper sacrificial insulating patterns DDSLa', and DDSLb' may be formed of a material different from that of the upper interlayer insulating patterns 93A', the first lower interlayer insulating patterns 91A1', the lower dummy interlayer insulating patterns 91B', and the upper dummy interlayer insulating patterns 93B'. In an embodiment, each of the upper interlayer insulating patterns 93A', the first lower interlayer insulating patterns 91A1', the lower dummy interlayer insulating patterns 91B', and the upper dummy interlayer insulating patterns 93B' may include a silicon oxide layer, and each of the lower sacrificial insulating patterns DSSLa' and DSSLb' and the upper sacrificial insulating patterns DWL', DDSLa', and DDSLb' may include a silicon nitride layer.

The second contact pattern 97' of the vertical connection structure VCT' may extend to be in contact with the first contact pattern 87'. The sidewall of the second contact pattern 97' may be surrounded by the second sidewall insulating layer 60'.

Hereinafter, manufacturing methods of semiconductor memory devices will be described in detail.

FIGS. 7A to 7J are sectional views, illustrating a manufacturing method of a semiconductor memory device in accordance with an embodiment of the present disclosure.

Referring to FIG. 7A, a doped semiconductor layer 125L may be formed on a substrate 101. The substrate 101 may include a first region A1 and a second region A2. A peripheral circuit may be formed in the first region A1 and the second region A2 of the substrate 101. Also, the substrate 101 may include interconnection structures 121 that are connected to the peripheral circuit. The peripheral circuit may include the row decoder RD and the page buffer PB of the peripheral circuit 30 as shown in FIG. 3. However, the embodiment of the present disclosure is not limited thereto.

In an embodiment, the interconnection structures 121 may be connected to impurity regions 105 of transistors constituting the row decoder RD and the page buffer PB. The impurity regions 105 may be defined in active regions defined by isolation layers 103 formed in the substrate 101, and include at least one of an n-type impurity and a p-type impurity. The interconnection structures 121 of the substrate 101 may be covered by a first lower insulating layer 123, and the doped semiconductor layer 125L may be formed on the first lower insulating layer 123.

The doped semiconductor layer 125L may include n-type impurity. In an embodiment, the doped semiconductor layer 125L may include n-type doped silicon.

Figure 7B:
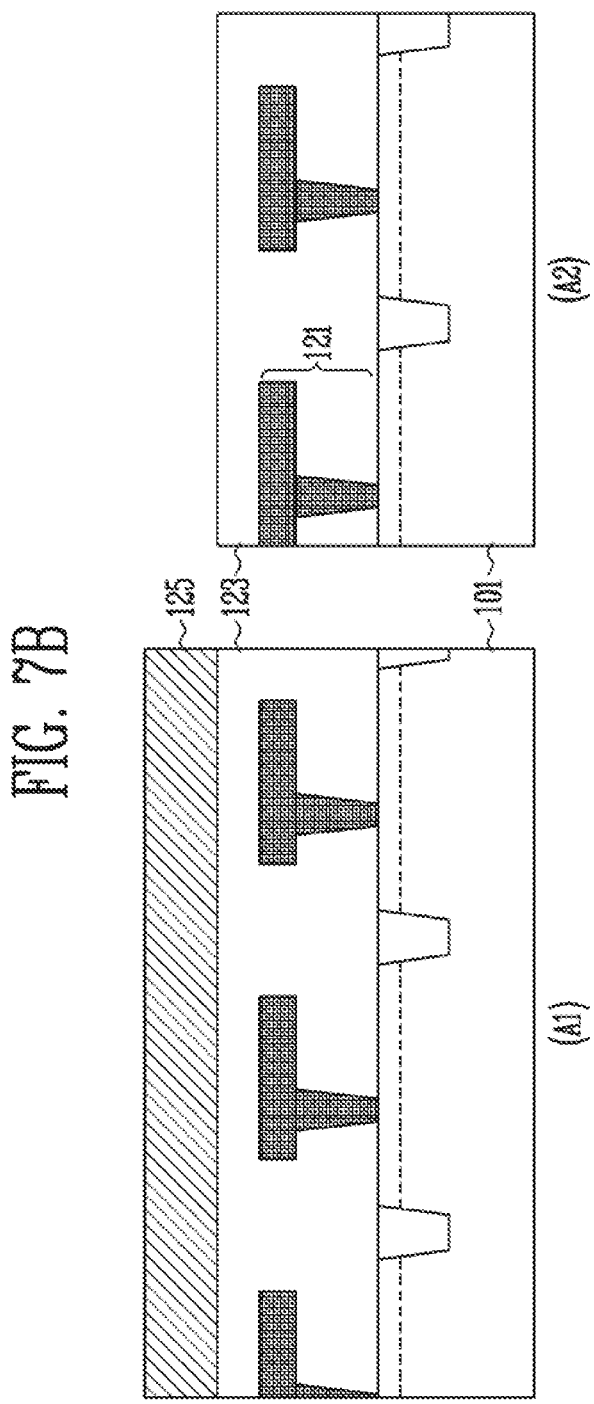

Referring to FIG. 7B, the doped semiconductor layer 125L as shown in FIG. 7A may be patterned through a photolithography process. Accordingly, a source layer 125 that overlaps with the first region A1 of the substrate 101 may be formed, and the first lower insulating layer 123 that overlaps with the second region A2 of the substrate 101 may be exposed.

Referring to FIG. 7C, a second lower insulating layer 127 may be formed on the first lower insulating layer 123. The second lower insulating layer 127 may overlap with the second region A2 of the substrate 101 and may be disposed at substantially the same level as the source layer 125.

Subsequently, a lower stack structure 130 may be formed in which first material layers 131 and second material layers 133 are alternately stacked. In an embodiment, each of the first material layers 131 may include an insulating layer, and each of the second material layers 133 may include a sacrificial layer with an etch selectivity with respect to the first material layers 131. For example, the insulating layer may include a silicon oxide layer, and the sacrificial layer may include a silicon nitride layer.

Subsequently, a first slit 135A and a lower contact hole 135B may be formed, which penetrate the lower stack structure 130. The first slit 135A may penetrate the first material layer 131 and the second material layers 133 to expose the source layer 125 that overlaps with the first region A1. The lower contact hole 135B may be formed while the first slit 135A is being formed. The lower contact hole 135B may penetrate the first material layers 131, the second material layers 133, the second lower insulating layer 127, and the first lower insulating layer 123 to overlap with the second region A2 and to expose an interconnection structure 121 that corresponds to the lower contact hole 135B.

The lower contact hole 135B may be formed by using the process of forming the first slit 135A. Therefore, a manufacturing process of the semiconductor memory device may be simplified without adding any separate process for forming the lower contact hole 135B.

The width of the lower contact hole 135B may be formed to be wider than that of the first slit 135A. In an embodiment, the width of the lower contact hole 135B may be formed to become two times or more of that of the first slit 135A.

Figure 7D:
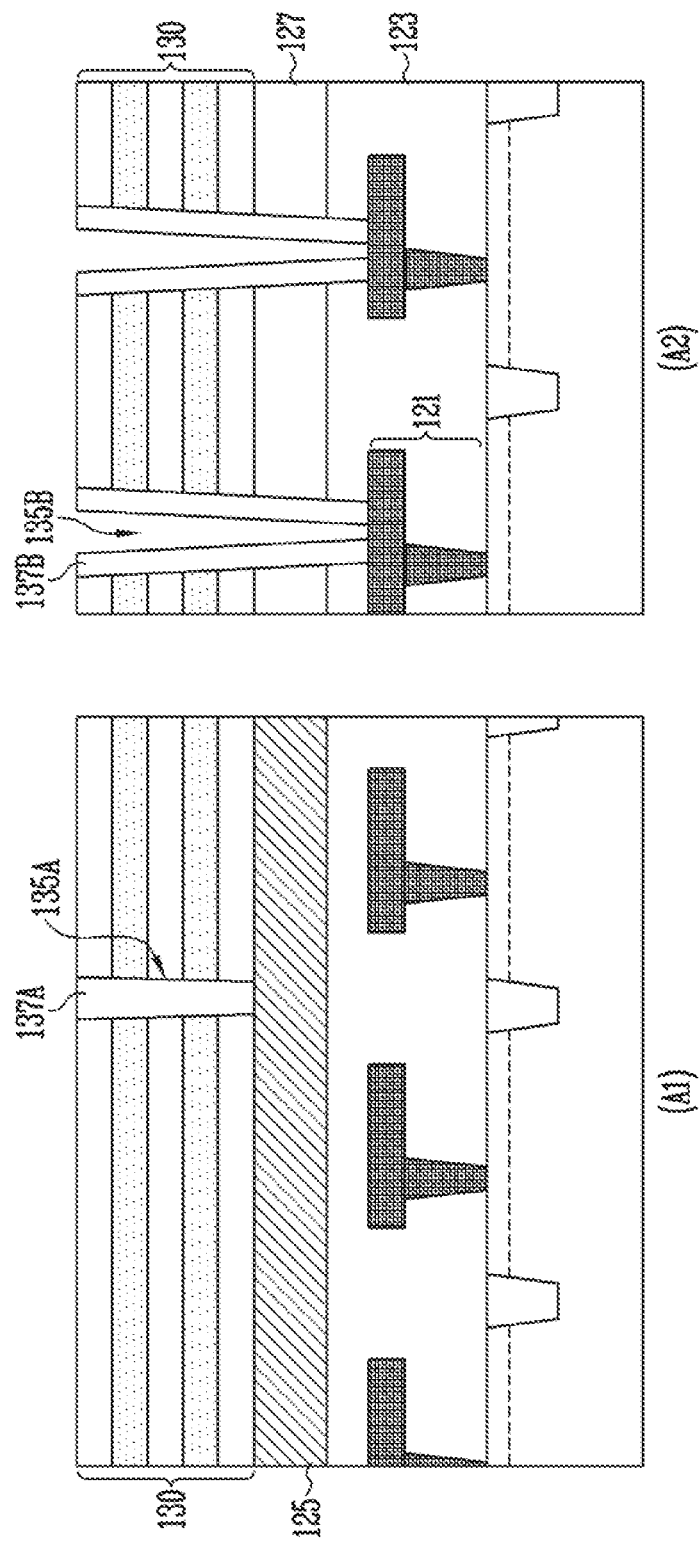

Referring to FIG. 7D, the first slit 135A may be filled with an isolation insulating layer 137A. A first sidewall insulating layer 137B covering a sidewall of the lower contact hole 135B may be formed by using the process of forming the isolation insulating layer 137A. In other words, the first sidewall insulating layer 137B may be formed during forming the isolation insulating layer 137A. In an embodiment, an insulating material for the isolation insulating layer 137A and the first sidewall insulating layer 137B may fill the first slit 135A, and be deposited to have a thickness with that a central region of the lower contact hole 135B may be opened. The deposited insulating material may be etched through an etch-back process, etc. such that an interconnection structure 121 is exposed through a bottom surface of the lower contact hole 135B. Accordingly, the isolation insulating layer 137A and the first sidewall insulating layer 137B may be formed. The lower contact hole 135B may be formed to have a width that is relatively wider than that of the first slit 135A. Therefore, the lower contact hole 135B may easily open the central region of the lowercontact hole 135B in the deposition of the insulating material.

As described above, the first sidewall insulating layer 137B may be formed while the isolation insulating layer 137A is being formed by using the width difference between the lower contact hole 135B and the first slit 135A. Therefore, the manufacturing process of the semiconductor memory device may be simplified.

Figure 7E:
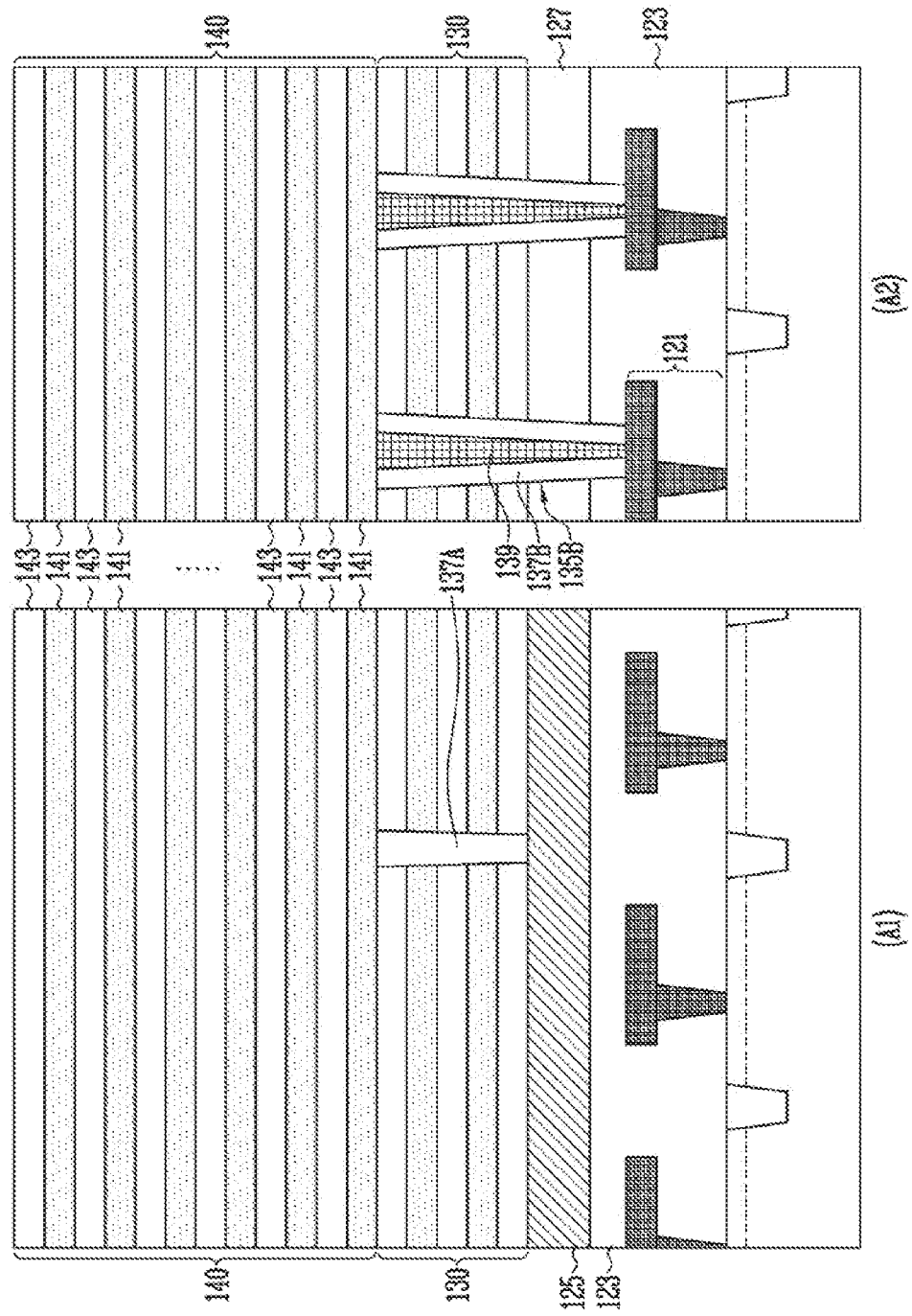

Referring to FIG. 7E, a first contact pattern 139 that is connected to the interconnection structure 121 may be formed by filling the lower contact hole 135B with a conductive material. The first contact pattern 139 may be formed on the first sidewall insulating layer 137B.

Subsequently, an upper stack structure 140 may be formed by alternately stacking third material layers 141 and fourth material layers 143. In an embodiment, each of the third material layers 141 may include the sacrificial layer described with reference to FIG. 7C, and each of the fourth material layers 143 may include the insulating layer described with reference to FIG. 7C. For example, each of the third material layers 141 may include a silicon nitride layer, and each of the fourth material layers 143 may include a silicon oxide layer.

The upper stack structure 140 that is disposed on the lower stack structure 130 may be formed to cover the isolation insulating layer 137A and the first contact pattern 139.

Referring to FIG. 7F, a first channel structure 159A1 and a second channel structure 159A2, which overlap with the first region A1, and a dummy channel structure 159B that overlaps with the second region A2 are formed. The dummy channel structure 159B may be formed on the first contact pattern 139 while the first channel structure 159A1 and the second channel structure 159A2 are being formed.

In an embodiment, the process of forming the first channel structure 159A1, the second channel structure 159A2, and the dummy channel structure 159B may include a process of forming a first channel hole 150A1, a second channel hole 150A2, and an upper contact hole 150B, a process of forming memory layers 151A and dummy memory layers 151B, a process of forming a channel layer 153, a process of forming a core insulating layer 155, and a process of forming a capping semiconductor layer 157.

The first channel hole 150A1 and the second channel hole 150A2 may penetrate the upper stack structure 140 and the lower stack structure 130, which overlap with the first region A1. The first channel hole 150A1 and the second channel hole 150A2 may be respectively disposed at both sides of the isolation insulating layer 137A. The upper contact hole 150B may be formed to expose the first contact pattern 139 while the first channel hole 150A1 and the second channel hole 150A2 are being formed. The upper contact hole 150B may penetrate the upper stack structure 140 that overlaps with the first contact pattern 139, and be formed to have the width that is narrower than that of the lower contact hole 135B.

The upper contact hole 150B may be formed by using the process of forming the first channel hole 150A1 and the second channel hole 150A2. Therefore, the manufacturing process of the semiconductor memory device may be simplified without adding any separate process for forming the upper contact hole 150B.

Memory layers 151A may be respectively formed on sidewalls of the first channel hole 150A1 and the second channel hole 150A2. While the memory layers 151A are being formed, a dummy memory layer 151B may be formed on a sidewall of the upper contact hole 150B. Each of the memory layers 151A and the dummy memory layer 151B may include the tunnel insulating layer TI, the data storage layer DL, and the blocking insulating layer BI, which are shown in FIG. 5B.

The first channel structure 159A1 and the second channel structure 159A2 may be formed on the memory layer 151A. The first channel structure 159A1 may be formed to fill the first channel hole 150A1, and the second channel structure 159A2 may be formed to fill the second channel hole 150A2. While the first channel structure 159A1 and the second channel structure 159A2 are being formed, the dummy channel structure 159B may be formed on the dummy memory layer 151B. The dummy channel structure 159B may be formed to fill the upper contact hole 150B.

In an embodiment, each of the first channel structure 159A1, the second channel structure 195A2, and the dummy channel structure 159B may include a channel layer 153, a core insulating layer 155, and a capping semiconductor layer 157. The channel layer 153 may be formed on each of the memory layer 151A and the dummy memory layer 151B. The channel layer 153 of each of the first channel structure 159A1 and the second channel structure 159A2 may be in contact with the source layer 125. The channel layer 153 may include a semiconductor layer. In an embodiment, the channel layer 153 may include a silicon layer. The core insulating layer 155 may be formed to fill a central region each of the first channel hole 150A1, the second channel hole 150A2 and the upper contact hole 150B. An upper end of the core insulating layer 155 may be recessed. The capping semiconductor layer 157 may be formed to fill the recessed portion of the core insulating layer 155. The capping semiconductor layer 157 may include a doped semiconductor layer. In an embodiment, the capping semiconductor layer 157 may include n-type silicon.

Referring to FIG. 7G, a mask pattern 161 may be formed, which covers the upper stack structure 140, the first channel structure 159A1, and the second channel structure 159A2, which overlap with the first region A1. The upper stack structure 140 that overlaps with the second region A2 and the dummy channel structure 159B as shown in FIG. 7F may be exposed through an opening of the mask pattern 161.

Subsequently, the dummy channel structure 159B as shown in FIG. 7F may be removed through an etching process using the mask pattern 161 as an etch barrier. Accordingly, a core region 163 of the upper contact hole 150B may be opened. The dummy memory layer 151B and the first contact pattern 139 may be exposed by the core region 163 opened by the upper contact hole 150B.

Referring to FIG. 7H, an inner insulating layer 165 may be formed on the dummy memory layer 151B. The inner insulating layer 165 may be formed to have a thickness that is thicker than that of the dummy memory layer 151B. The inner insulating layer 165 may extend along the sidewall of the upper contact hole 150B and may be removed on a bottom surface of the upper contact hole 150B. Accordingly, the first contact pattern 139 may be exposed through the core region 163.

Referring to FIG. 7I, a second contact pattern 167 that is connected to the first contact pattern 139 may be formed by filling the core region 163 as shown in FIG. 7H with a conductive material. The second contact pattern 167 may be formed on a second sidewall insulating layer with the dummy memory layer 151B and the inner insulating layer 165.

Figure 7J:
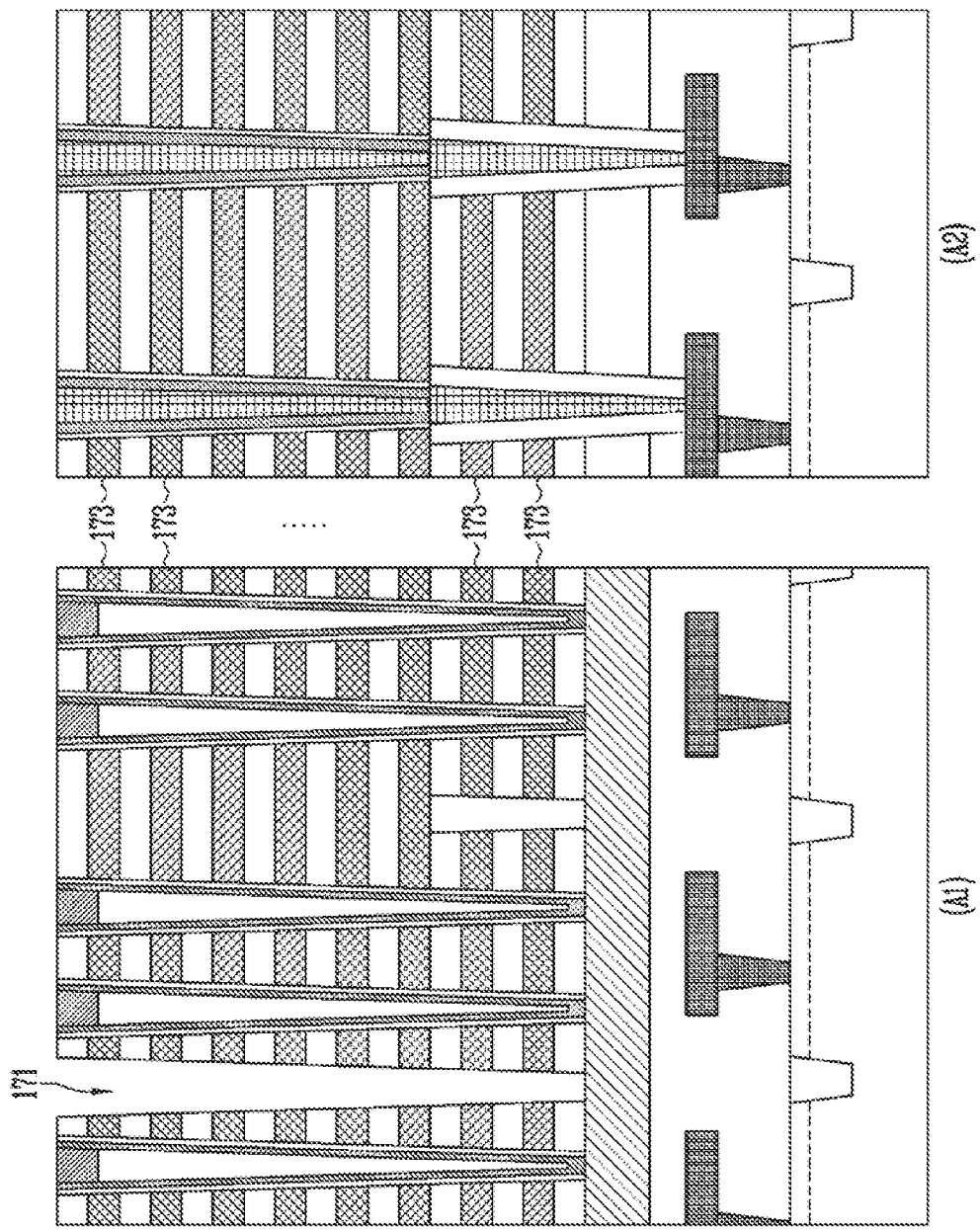

Referring to FIG. 7J, a second slit 171 may be formed, which penetrates the upper stack structure 140 and the lower stack structure 130, which are shown in FIG. 7I. The third material layers 141 of the upper stack structure 140 and the second material layers 133 of the lower stack structure 130, each being formed as the sacrificial layer, may be selectively removed through the second slit 171, and regions in which the third material layers 141 and the second material layers 133 are removed may be filled with conductive patterns 173. That is, the third material layers 141 of the upper stack structure 140 and the second material layers 133 of the lower stack structure 130, each that is formed as the sacrificial layer, may be replaced with the conductive patterns 173 through the second slit 171.

Figure 8A:
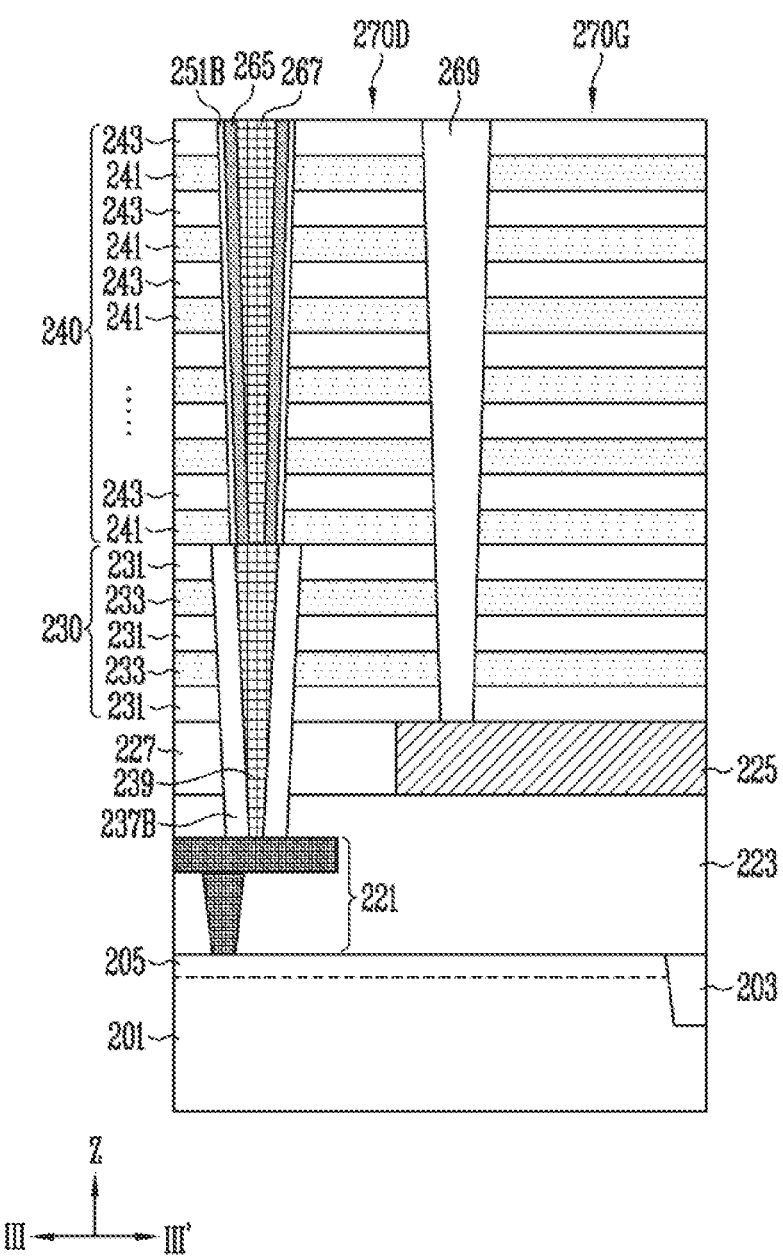
FIGS. 8A to 8C are sectional views, illustrating a manufacturing method of a semiconductor memory device in accordance with an embodiment of the present disclosure.
Figure 8B:
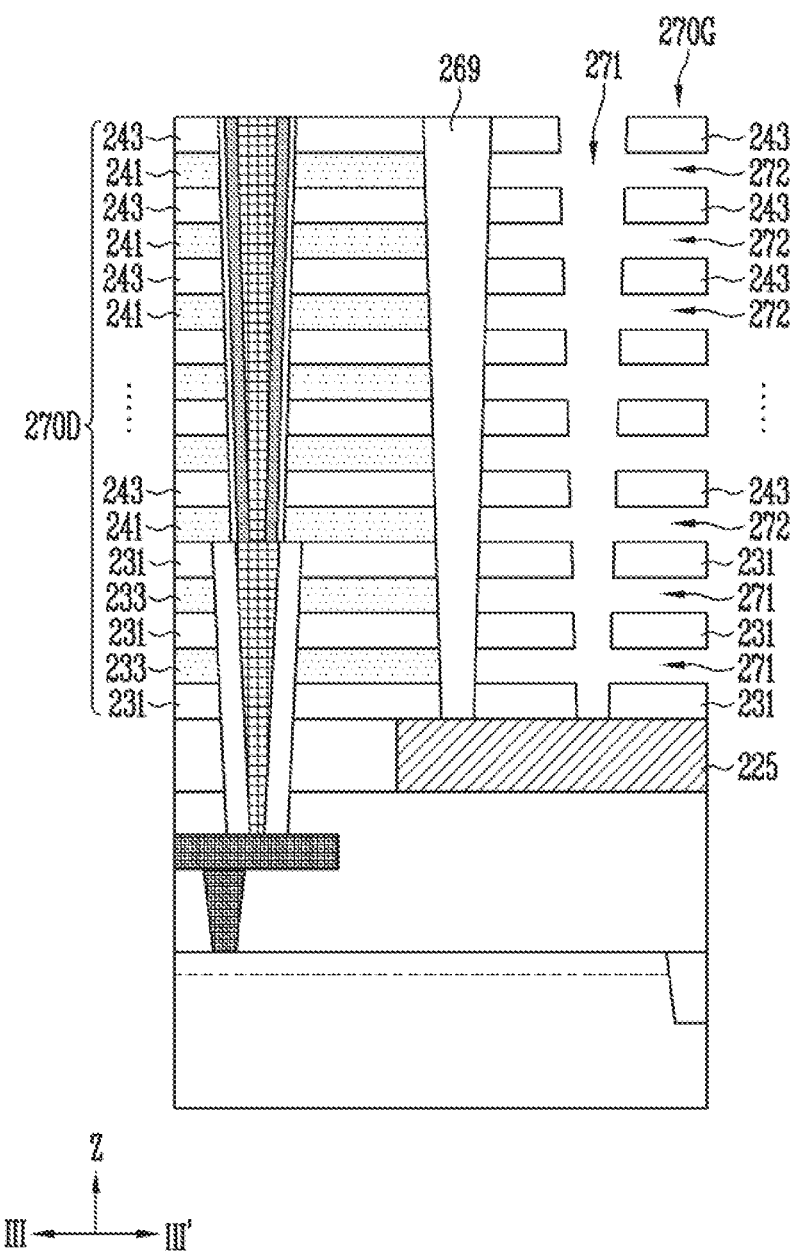
Figure 8C:
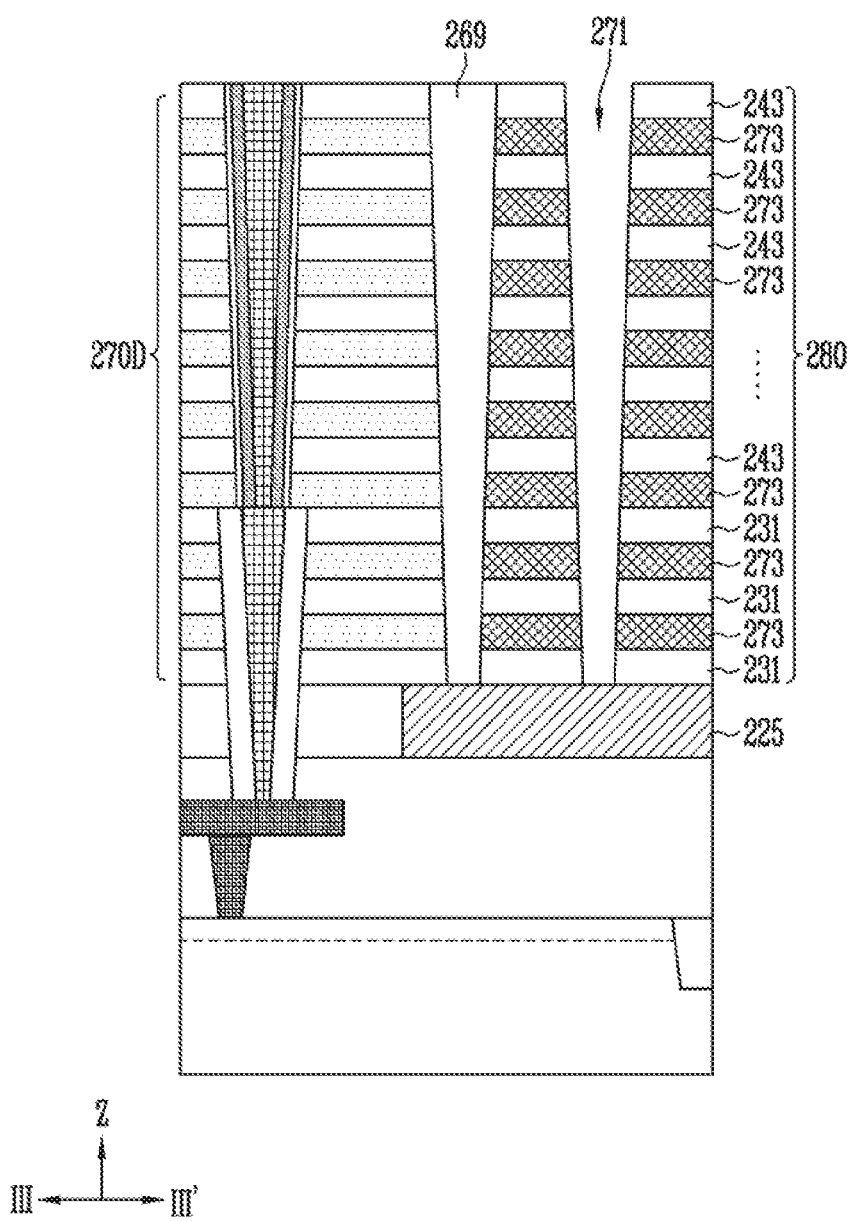

FIGS. 8A to 8C are sectional views, illustrating a manufacturing method of a semiconductor memory device in accordance with an embodiment of the present disclosure.

Referring to FIG. 8A, an impurity region 205 of a peripheral circuit, an interconnection structure 221, a first lower insulating layer 223, a second lower insulating layer 227, a source layer 225, a lower stack structure 230, a first sidewall insulating layer 237B, a first contact pattern 239, an upper stack structure 240, a dummy memory layer 251B, an inner insulating layer 265, and a second contact pattern 267 may be formed by using the processes that are described with reference to FIGS. 7A to 7I. The impurity region 205 may be formed in an active region of a substrate 201 defined by an isolation layer 203. The interconnection structure 221 may be connected to the impurity region 205. Although not shown in the drawings, the processes for forming the first slit 135A and the isolation insulating layer 137A, which are shown in FIGS. 7C and 7D, and the processes for forming the first channel structure 159A1, the second channel structure 159A2, and the memory layer 151A, which are shown in FIG. 7F, may be performed in a cell region spaced apart from a region as shown in FIG. 8A.

Subsequently, a barrier insulating layer 269 may be formed, which penetrates the upper stack structure 240 and the lower stack structure 230 and overlaps with the source layer 225. The upper stack structure 240 and the lower stack structure 230 may be isolated into a dummy stack structure 270D and a preliminary gate stack structure 270G by the barrier insulating layer 269. The dummy stack structure 270D may be patterned to surround a vertical connection structure with the first contact pattern 239 and the second contact pattern 267.

The lower stack structure 230 may include first material layers 231 and second material layers 233, which are alternately stacked, and the upper stack structure 240 may include third material layers 241 and fourth material layers 243, which are alternately stacked. The first material layers 231 and the fourth material layers 243 may include an insulating material for interlayer insulating layers, and the second material layers 233 and the third material layers 241 may include sacrificial layers with an etch selectivity with respect to the interlayer insulating layers. In an embodiment, the first material layers 231 and the fourth material layers 243 may include silicon oxide, and the second material layers 233 and the third material layers 241 may include silicon nitride.

Referring to FIG. 8B, a second slit 271 may be formed, which penetrates the preliminary gate stack structure 270G as shown in FIG. 8A. The second material layers 233 and the third material layers 241 of the preliminary gate stack structure 270G may be selectively removed through the second slit 271. Accordingly, horizontal spaces 272 may be opened between the first material layers 231 and the fourth material layers 243 of the preliminary gate stack structure 270G.

During an etching process for opening the horizontal spaces 272, the second material layers 233 and the third material layers 241 of the dummy stack structure 270D may remain while being protected through the barrier insulating layer 269.

Referring to FIG. 8C, the horizontal spaces 272 as shown in FIG. 8B may be respectively filled with conductive patterns 273. Accordingly, a gate stack structure 280 may be defined.

In the embodiments, the interconnection structure has been described based on the structure that is connected to the impurity region, but the present disclosure is not limited thereto. In an embodiment, the interconnection structure may be connected to gate electrodes of transistors constituting the peripheral circuit.

Figure 9:
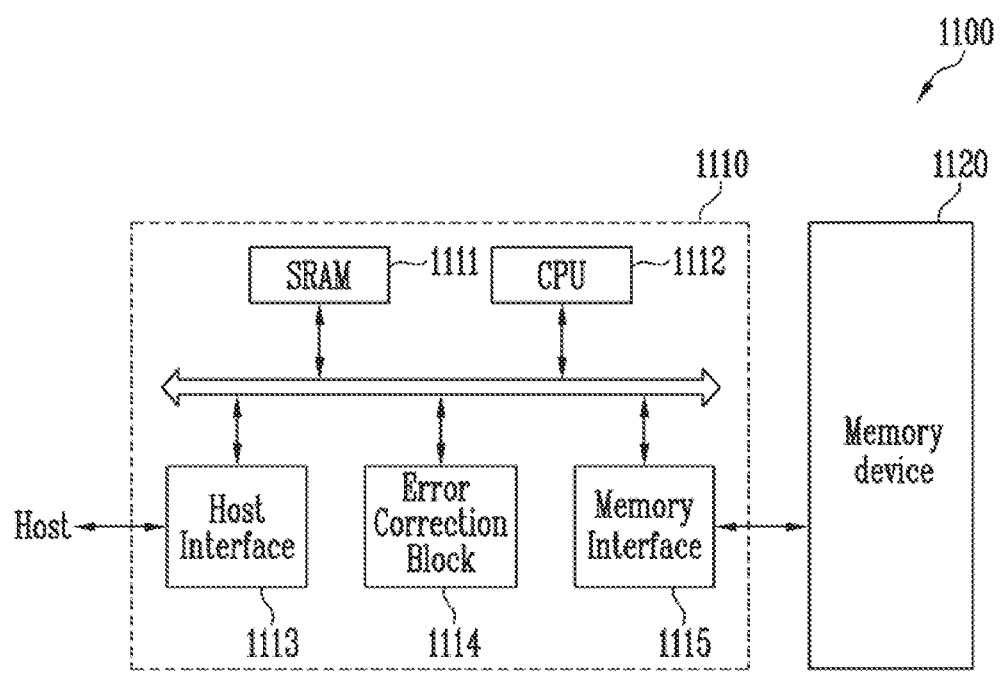
FIG. 9 is a block diagram, illustrating a configuration of a memory system in accordance with an embodiment of the present disclosure.

FIG. 9 is a block diagram, illustrating a configuration of a memory system in accordance with an embodiment of the present disclosure.

Referring to FIG. 9, the memory system 1100 includes a memory device 1120 and a memory controller 1110.

The memory device 1120 may include a vertical connection structure with a first contact pattern and a second contact pattern. An interface between the first contact pattern and the second contact pattern may be disposed at substantially the same level as that between an isolation insulating layer for isolating a first select group and a second select group of a memory cell array from each other and an upper gate stack structure that overlaps with the isolation insulating layer. The width of a lower contact hole filled with the first contact pattern may be formed to be wider than that of the isolation insulating layer.

The memory device 1120 may be a mufti-chip package configured with a plurality of flash memory chips.

The memory controller 1110 may control the memory device 1120, and may include a Static Random Access Memory (SRAM) 1111, a Central Processing Unit (CPU) 1112, a host interface 1113, an error correction block 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host that is connected with the memory system 1100. The error correction block 1114 may detect and correct an error that is included in a data that is read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a Solid State Drive (SSD), in which the memory device 1120 is combined with the memory controller 1110. For example, when the memory system 1100 is an SSD, the memory controller 1100 may communicated with an external device (e.g., the host) through one among various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (DATA) protocol, a Small Computer Small Interface (SCSI) protocol, an Enhanced Small Disk Interface (ESDI) protocol, and an Integrated Drive Electronics (IDE) protocol.

Figure 10:
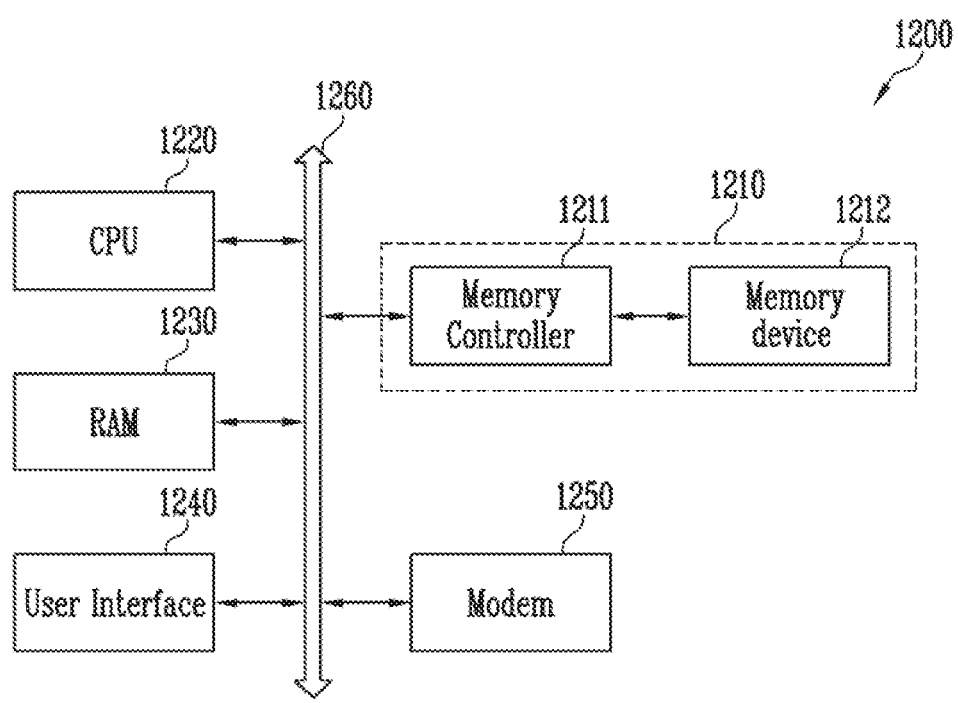
FIG. 10 is a block diagram, illustrating a configuration of a computing system in accordance with an embodiment of the present disclosure.

FIG. 10 is a block diagram, illustrating a configuration of a computing system in accordance with an embodiment of the present disclosure.

Referring to FIG. 10, the computing system 1200 may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, an image processor, an image sensor, a mobile DRAM, and the like may be further included. The image sensor may include a complimentary metal-oxide semiconductor (CMOS) image sensor (CIS).

The memory system 1210 may be configured with a memory device 1212 and a memory controller 1211 as described with reference to FIG. 9.

In accordance with the present disclosure, a lower contact hole for a first contact pattern may be formed by using a slit forming process for isolating lower select groups from each other. Therefore the manufacturing process of the semiconductor memory device may be simplified.

In accordance with the present disclosure, a sidewall insulating layer on a sidewall of the lower contact hole may be formed by using an isolation insulating layer forming process for filling a slit. Therefore the manufacturing process of the semiconductor memory device may be simplified.

What is claimed is:

1. A semiconductor memory device comprising:
   a first select group and a second select group isolated from each other by an isolation insulating layer on a plane of a substrate;
   an upper gate stack structure extending to be parallel to the plane and extending to overlap with the first select group, the isolation insulating layer, and the second select group, the upper gate stack structure including upper conductive patterns and upper interlayer insulating patterns that are alternately stacked in a stacking direction that intersects the plane;
   channel structures extending to penetrate the first select group, the second select group, and the upper gate stack structure; and
   a vertical connection structure spaced apart from the first select group, the second select group, and the upper gate stack structure on the plane, the vertical connection structure extending to be parallel to the channel structures,
   wherein the vertical connection structure includes a first contact pattern that extends toward the substrate from a level at which the isolation insulating layer is disposed and a second contact pattern that extends in the stacking direction from the first contact pattern.

2. The semiconductor memory device of claim 1, wherein an interface between the first contact pattern and the second contact pattern is disposed at a same level as a level at which the isolation insulating layer and the upper gate stack structure are connected.

3. The semiconductor memory device of claim 1, wherein the first contact pattern and the second contact pattern have different width at a level at which an interface between the isolation insulating layer and the upper gate stack structure is disposed.

4. The semiconductor memory device of claim 1, further comprising:
   a first sidewall insulating layer surrounding a sidewall of the first contact pattern; and
   a second sidewall insulating layer surrounding a sidewall of the second contact pattern.

5. The semiconductor memory device of claim 4, wherein the second sidewall insulating layer extends to cover an interface between the first contact pattern and the first sidewall insulating layer.

6. The semiconductor memory device of claim 4, wherein the second sidewall insulating layer includes:
   an inner insulating layer surrounding the sidewall of the second contact pattern; and
   a dummy memory layer surrounding the inner insulating layer.

7. The semiconductor memory device of claim 6, further comprising a memory layer surrounding each of the channel structures,
   wherein the dummy memory layer is comprised of a same material as the memory layer.

8. The semiconductor memory device of claim 1, further comprising:
   a peripheral circuit formed in the substrate;
   an interconnection structure connected to the peripheral circuit;
   a first lower insulating layer covering the peripheral circuit and the interconnection structure;
   a source layer between the first lower insulating layer and the first select group, the source layer extending to overlap with the second select group;
   a second lower insulating layer covering the first lower insulating layer at a same level as the source layer;
   a lower dummy stack structure surrounding the first contact pattern on the second lower insulating layer; and
   an upper dummy stack structure surrounding the second contact pattern on the lower dummy stack structure,
   wherein the first contact pattern penetrates the second lower insulating layer and the first lower insulating layer to be in contact with the interconnection structure.

9. The semiconductor memory device of claim 8, wherein the lower dummy stack structure is disposed at the same level as the first select group and the second select group, and
   wherein the upper dummy stack structure is disposed at the same level as the upper gate stack structure.

10. The semiconductor memory device of claim 8, wherein each of the first select group and the second select group includes a lower interlayer insulating pattern and a lower conductive pattern that are alternately stacked in the stacking direction.

11. The semiconductor memory device of claim 8, wherein the lower dummy stack structure includes lower dummy interlayer insulating patterns and lower dummy conductive patterns that are alternately stacked in the stacking direction, and
   the upper dummy stack structure includes upper dummy conductive patterns and upper dummy interlayer insulating patterns that are alternately stacked in the stacking direction.

12. The semiconductor memory device of claim 8, wherein the lower dummy stack structure includes lower dummy interlayer insulating patterns and lower sacrificial insulating patterns that are alternately stacked in the stacking direction, and
   the upper dummy stack structure includes upper dummy conductive patterns and upper sacrificial insulating patterns that are alternately stacked in the stacking direction.

13. A semiconductor memory device comprising:
- a substrate including a peripheral circuit that is disposed in a first region and a second region and including an interconnection structure that is connected to the peripheral circuit;
- a first select group and a second select group overlapping with the first region of the substrate, the first select group and the second select group isolated from each other by an isolation insulating layer on a plane that is parallel to the substrate;
- a first channel structure penetrating the first select group;
- a second channel structure penetrating the second select group;
- a lower dummy stack structure overlapping with the second region of the substrate, the lower dummy stack structure being spaced apart from the first select group and the second select group on the plane;
- a lower contact hole penetrating the lower dummy stack structure, the lower contact hole extending toward the interconnection structure;
- a first sidewall insulating layer formed on a sidewall of the lower contact hole; and
- a first contact pattern filling the lower contact hole, surrounded by the first sidewall insulating layer; to be connected to the interconnection structure,
- wherein a width of the lower contact hole is formed to be wider than that of the isolation insulating layer.

14. The semiconductor memory device of claim 13, further comprising:
- a source layer disposed under the first select group, the isolation insulating layer, and the second select group, the source layer overlapping with the first region of the substrate to be connected to the first channel structure and the second channel structure;
- a first lower insulating layer disposed between the source layer and the substrate, the first lower insulating layer extending to overlap with the first region and the second region of the substrate;
- a second lower insulating layer disposed between the lower dummy stack structure and the first lower insulating layer;
- an upper gate stack structure extending to be parallel to the plane to overlap with the first select group, the isolation insulating layer, and the second select group, the upper gate stack structure with upper conductive patterns and upper interlayer insulating patterns that are alternately stacked in a stacking direction that intersects the plane;
- a memory layer surrounding a sidewall of each of the first channel structure and the second channel structure;
- an upper dummy stack structure disposed on the lower dummy stack structure;
- a second contact pattern penetrating the upper dummy stack structure, the second contact pattern connected to the first contact pattern; and
- a second sidewall insulating layer surrounding a sidewall of the second contact pattern,
- wherein the first channel structure, the second channel structure, and the memory layer extend to penetrate the upper gate stack structure,
- wherein the lower contact hole, the first sidewall insulating layer, and the first contact pattern penetrate the first lower insulating layer and the second lower insulating layer.

15. The semiconductor memory device of claim 14, wherein the second sidewall insulating layer extends to cover an interface of the first contact pattern and the first sidewall insulating layer.

16. The semiconductor memory device of claim 14, wherein the second sidewall insulating layer includes:
- an inner insulating layer surrounding the sidewall of the second contact pattern; and
- a dummy memory layer surrounding the inner insulating layer, the dummy memory layer including the same material as the memory layer.

* * * * *